(12) United States Patent
Park et al.

(10) Patent No.: US 11,171,133 B2
(45) Date of Patent: Nov. 9, 2021

(54) SEMICONDUCTOR DEVICE

(71) Applicant: SAMSUNG ELECTRONICS CO., LTD., Suwon-si (KR)

(72) Inventors: Beomjin Park, Hwaseong-si (KR); Dongil Bae, Seongnam-si (KR); Daewon Kim, Hwaseong-si (KR); Taeyoung Kim, Hwaseong-si (KR); Joohee Jung, Suwon-si (KR); Jaehoon Shin, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 0 days.

(21) Appl. No.: 16/927,636

(22) Filed: Jul. 13, 2020

(65) Prior Publication Data
US 2021/0193654 A1   Jun. 24, 2021

(30) Foreign Application Priority Data
Dec. 20, 2019   (KR) .................. 10-2019-0171517

(51) Int. Cl.
*H01L 27/088* (2006.01)
*H01L 29/78* (2006.01)
*H01L 29/786* (2006.01)
*H01L 29/423* (2006.01)

(52) U.S. Cl.
CPC .... *H01L 27/0886* (2013.01); *H01L 29/42392* (2013.01); *H01L 29/785* (2013.01); *H01L 29/78696* (2013.01)

(58) Field of Classification Search
CPC .............. H01L 27/0886; H01L 29/785; H01L 29/42392; H01L 29/78696; H01L 29/7827
See application file for complete search history.

(56) References Cited

U.S. PATENT DOCUMENTS

| 8,551,833 | B2 | 10/2013 | Chang et al. |
| 9,484,406 | B1 | 11/2016 | Sun et al. |
| 9,502,518 | B2 | 11/2016 | Liu et al. |
| 9,780,166 | B2 | 10/2017 | Leobandung |
| 10,096,607 | B1* | 10/2018 | Guillorn ............. H01L 29/7855 |
| 10,121,875 | B1 | 11/2018 | Ho et al. |
| 10,193,090 | B2 | 1/2019 | Lu et al. |

(Continued)

*Primary Examiner* — Changhyun Yi
(74) *Attorney, Agent, or Firm* — F. Chau & Associates, LLC

(57) ABSTRACT

A semiconductor device includes an active pattern extending on a substrate in a first direction, divided into a plurality of regions by a separation region, and having a first edge portion exposed toward the separation region; first, second and third channel layers vertically separated and sequentially disposed on the active pattern; a first gate electrode extending in a second direction, intersecting the active pattern, and surrounding the first, second and third channel layers; source/drain regions disposed on the active pattern, on at least one side of the first gate electrode, and contacting the first, second and third channel layers; a semiconductor structure including first semiconductor layers and second semiconductor layers alternately stacked on the active pattern, and having a second edge portion exposed toward the separation region; and a blocking layer covering at least one of an upper surface, side surfaces, or the second edge portion, of the semiconductor structure.

20 Claims, 33 Drawing Sheets

(56) References Cited

U.S. PATENT DOCUMENTS

| | | |
|---|---|---|
| 10,236,362 B2 | 3/2019 | Seo |
| 10,879,308 B1 * | 12/2020 | Ando .................... G06N 3/061 |
| 2006/0049429 A1 | 3/2006 | Kim et al. |
| 2018/0323312 A1 | 11/2018 | Van Dal et al. |
| 2020/0035705 A1 | 1/2020 | Kim et al. |
| 2021/0043763 A1 | 2/2021 | Jung et al. |

* cited by examiner

SEMICONDUCTOR DEVICE

CROSS-REFERENCE TO RELATED APPLICATION(S)

This application claims the benefit under 35 U.S.C. § 119 of Korean Patent Application No. 10-2019-0171517, filed on Dec. 20, 2019, in the Korean Intellectual Property Office, the disclosure of which is incorporated by reference herein in its entirety.

TECHNICAL FIELD

The present inventive concept relates to a semiconductor device.

DISCUSSION OF RELATED ART

As the demand for high performance, high speed, and/or multifunctionality in a semiconductor device increases, the degree of integration of the semiconductor device also increases. In manufacturing a semiconductor device having a fine pattern corresponding to the current trend toward high integration, it is desirable to implement patterns having a fine width or a fine separation distance. In addition, efforts are being made to develop a semiconductor device including a fin field-effect transistor (FinFET) having a three-dimensionally structured channel to overcome limitations in operating characteristics due to the continue downscaling of a planar metal oxide semiconductor field-effect transistor (MOSFET). Also, to overcome the physical scaling and performance limitations of FinFETs, gate all around (GAA) transistors that feature a gate on all four sides of the channel are being developed.

SUMMARY

Example embodiments of the present inventive concept provide a semiconductor device having enhanced reliability.

According to an example embodiment of the present inventive concept, a semiconductor device includes an active pattern extending on a substrate in a first direction and having first side surfaces opposing each other and a first edge portion connected to the first side surfaces, a plurality of channel layers spaced apart from each other vertically on the active pattern, a first gate electrode extending in a second direction, while intersecting the active pattern and the plurality of channel layers, on the substrate, and surrounding the plurality of channel layers, source/drain regions disposed on the active pattern, on at least one side of the first gate electrode, and contacting the plurality of channel layers, a semiconductor structure disposed adjacent to the first edge portion of the active pattern, and having second side surfaces opposing each other and a second edge portion connected to the second side surfaces, the semiconductor structure including a plurality of first semiconductor layers and a plurality of second semiconductor layers, alternately stacked on each other on the active pattern, a second gate electrode extending in the second direction on the substrate and surrounding the first edge portion of the active pattern and the second edge portion of the semiconductor structure, and a blocking layer disposed between the semiconductor structure and the second gate electrode.

According to an example embodiment of the present inventive concept, a semiconductor device includes an active pattern extending on a substrate in a first direction, divided into a plurality of regions by a separation region, and having a first edge portion exposed toward the separation region, first, second and third channel layers vertically spaced apart from each other and sequentially disposed on the active pattern, a first gate electrode extending in a second direction while intersecting the active pattern, on the substrate, and surrounding the first, second and third channel layers, source/drain regions disposed on the active pattern, on at least one side of the first gate electrode, and contacting the first, second and third channel layers, a semiconductor structure including first semiconductor layers and second semiconductor layers alternately stacked on the active pattern, and having a second edge portion exposed toward the separation region, and a blocking layer covering at least one of an upper surface, side surfaces, or the second edge portion, of the semiconductor structure.

According to an example embodiment of the present inventive concept, a semiconductor device includes an active pattern extending on a substrate in a first direction, and divided into a plurality of regions by a separation region, a semiconductor structure disposed adjacent to the separation region, on the active pattern, a first gate electrode extending in a second direction while intersecting the active pattern, on the substrate, a second gate electrode extending in the second direction while intersecting the semiconductor structure, on the substrate, and surrounding the semiconductor structure, source/drain regions disposed on the active pattern, on at least one side of the first gate electrode, and a blocking layer covering the semiconductor structure.

BRIEF DESCRIPTION OF THE DRAWINGS

The above and other aspects and features of the present inventive concept will be more clearly understood from the following detailed description, taken in conjunction with the accompanying drawings, in which.

Figure 1:
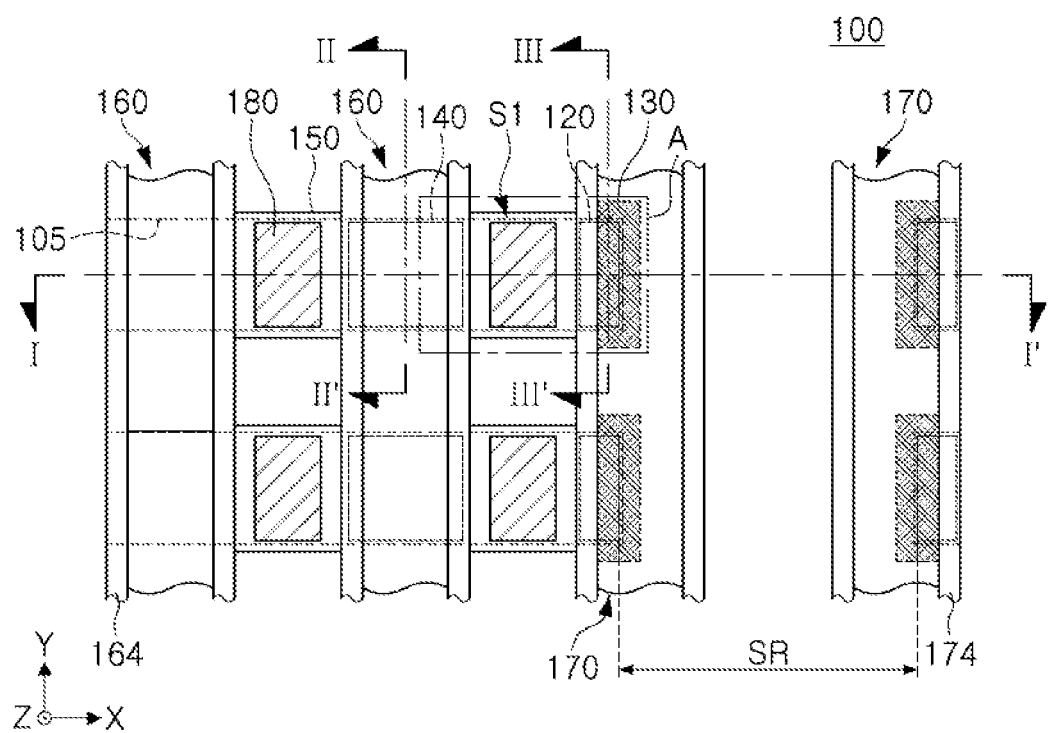
FIG. 1 is a plan view illustrating a semiconductor device according to an example embodiment of the present inventive concept.

Since the drawings in FIGS. 1-19B are intended for illustrative purposes, the elements in the drawings are not necessarily drawn to scale. For example, some of the elements may be enlarged or exaggerated for clarity purpose.

DETAILED DESCRIPTION OF THE EMBODIMENTS

Hereinafter, example embodiments of the present inventive concept will be described with reference to the accompanying drawings.

FIG. 1 is a plan view illustrating a semiconductor device according to an example embodiment of the present inventive concept.

Figure 2:
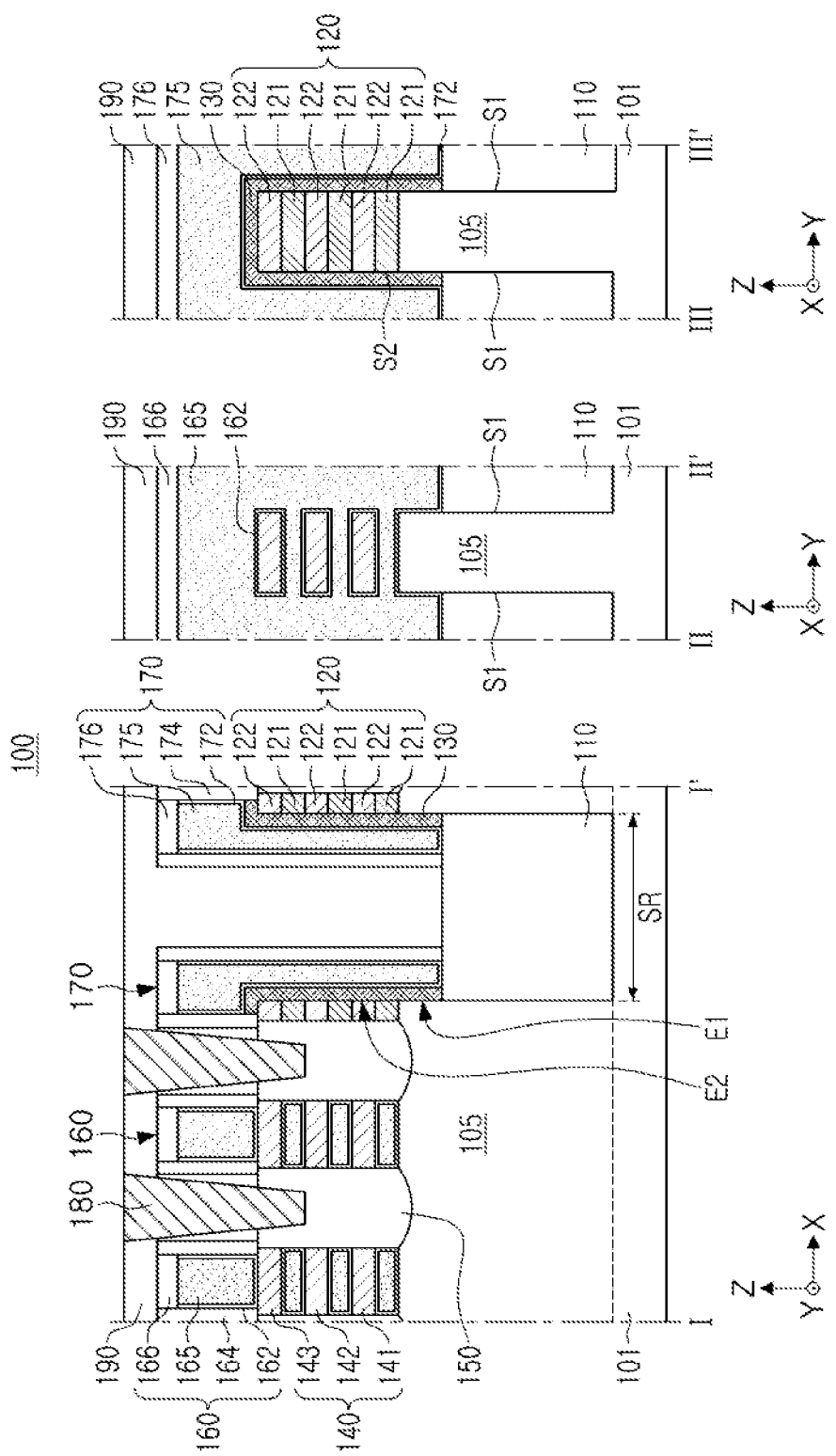
FIG. 2 is a cross-sectional view illustrating a semiconductor device according to an example embodiment of the present inventive concept.

FIG. 2 is a cross-sectional view illustrating a semiconductor device according to an example embodiment of the present inventive concept. FIG. 2 illustrates cross-sections of the semiconductor device of FIG. 1 taken along lines I-I', II-II' and III-III'. For convenience of description, only the main components of the semiconductor device are illustrated in FIGS. 1 and 2.

Figure 3:
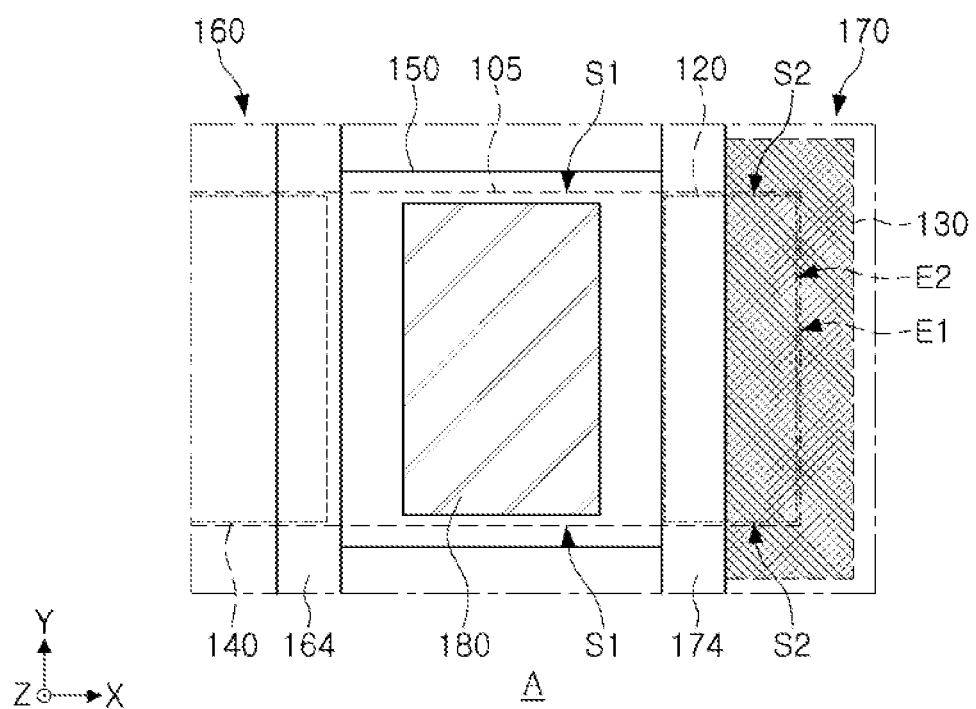
FIG. 3 is a plan view illustrating a semiconductor device according to an example embodiment of the present inventive concept.

FIG. 3 is a plan view illustrating a semiconductor device according to an example embodiment of the present inventive concept. FIG. 3 is an enlarged view of area "A" of FIG. 1.

First, referring to FIGS. 1 and 2, a semiconductor device 100 may include a substrate 101, an active pattern 105 having a line shape or a bar shape on the substrate 101, channel structures 140 including a plurality of channel layers 141, 142 and 143 that are vertically spaced apart from each other on the active pattern 105, source/drain regions 150 being in contact with the plurality of channel layers 141, 142 and 143, first and second gate structures 160 and 170 extending while intersecting the active pattern 105, and contact plugs 180 connected to the source/drain regions 150. The first gate structure 160 may be vertically overlapped, for example, overlapped in the Z direction, with the plurality of channel layers 141, 142 and 143. The semiconductor device 100 may further include device isolation layers 110, a semiconductor structure 120, a blocking layer 130, and an interlayer insulating layer 190. The semiconductor structure 120 may include first semiconductor layers 121 and second semiconductor layers 122 that are alternately stacked. The first and second gate structures 160 and 170 include first and second gate dielectric layers 162 and 172, first and second gate electrodes 165 and 175, first and second spacer layers 164 and 174, and first and second gate capping layers 166 and 176, respectively.

In the semiconductor device 100, the active pattern 105 has a fin structure, and the first gate electrode 165 may be disposed between the active pattern 105 and the channel structure 140, between the plurality of channel layers 141, 142 and 143 of the channel structures 140, and on the channel structure 140. Accordingly, the semiconductor device 100 may include multi-bridge channel field-effect transistors (MBCFET™) constituted by the channel structures 140, the source/drain regions 150, and the first gate structures 160. The first gate electrode 165 may three-dimensionally surround the plurality of channel layers 141, 142 and 143 of the channel structure 140. Since the first gate electrode 165 may wrap around the plurality of channel layers 141, 142 and 143, the semiconductor device 100 may include a gate all around (GAA) transistor structure. However, the present inventive concept is not limited thereto. For example, the active pattern 105 may have a fin structure and may be a fin field-effect transistor (FinFET) that is a transistor in which a channel region of the transistor is formed in the active pattern 105 that intersects the gate electrode.

The substrate 101 may have an upper surface extending in the X direction and the Y direction, and may include a semiconductor material, such as a group IV semiconductor, a group III-V compound semiconductor, or a group II-VI compound semiconductor. For example, the group IV semiconductor may include silicon (Si), germanium (Ge), or silicon germanium (SiGe). The group III-V compound semiconductor may include, for example, gallium phosphide (GaP), gallium arsenide (GaAs), indium arsenide (InAs), indium phosphide (InP), gallium antimonide (GaSb), indium antimonide (InSb), or indium gallium arsenide (InGaAs). The group II-VI compound semiconductor may include, for example, cadmium selenide (CdSe), cadmium sulfide (CdS), cadmium telluride (CdTe), zinc oxide (ZnO), zinc selenide (ZnSe), zinc sulfide (ZnS), or zinc telluride (ZnTe). The substrate 101 may be provided as a bulk wafer, an epitaxial layer, a silicon on insulator (SOI) layer, or a semiconductor on insulator (SeOI) layer.

The active pattern 105 is defined by the device isolation layer 110 formed in the substrate 101, and may be disposed to extend in a first direction, for example, in the X direction. However, the present inventive concept is not limited thereto. For example, the active pattern 105 may be disposed in an oblique bar shape extending in a direction other than the X direction and the Y direction. The active pattern 105 may have a structure protruding upward from the substrate 101. The upper end of the active pattern 105 may be disposed to protrude from an upper surface (or a top surface) of the device isolation layer 110 to a predetermined height. The device isolation layer 110 may not cover the upper portions of the active pattern 105, and may cover sidewalls of lower portions of the active pattern 105. The active pattern 105 may be divided into a plurality of regions in the first direction, for example, the X direction, by a separation region SR, and may include first side surfaces S1 opposing each other in the second direction, for example, in the Y direction, and a first edge portion E1 connected to the first side surfaces S1 and exposed toward the separation region SR. The separation region SR may separate transistors from each other in the first direction, for example, the X direction. The active pattern 105 may be formed of a portion of the substrate 101 or may include an epitaxial layer grown from the substrate 101. The active patterns 105 formed on the substrate 101 may be partially recessed on both sides of the first and second gate structures 160 and 170, and the source/drain regions 150 may be disposed on the recessed active pattern 105. Thus, the source/drain regions 150 may be provided in the recessed upper portion of the active patterns 105. For example, the source/drain regions 150 may be disposed on the active pattern 105, and on at least one side of the first gate structure 160 (or first gate electrode 165). Accordingly, as illustrated in FIG. 2, the active pattern 105 may have a relatively high height below the channel structure 140 and the first and second gate structures 160 and 170. According to an example embodiment of the present inventive concept, the active pattern 105 may include impurities, and at least portions of the active patterns 105 may include impurities of different conductivity types from each other, but the present inventive concept is not limited thereto.

The device isolation layer 110 may define the active pattern 105 on the substrate 101, and may be formed by, for example, a shallow trench isolation (STI) process. For example, the active pattern 105 may be defined by a shallow trench formed in the upper portion of the substrate 101, the device isolation layer 110 may fill the shallow trench. The device isolation layer 110 may expose upper sidewalls of the active pattern 105. According to an example embodiment of the present inventive concept, the device isolation layer 110 may also include a region extending to be relatively deeper to the lower portion of the substrate 101, between the active patterns 105. The device isolation layer 110 may have a curved upper surface having a higher level as it is more adjacent to the active pattern 105, but the shape of the upper surface of the device isolation layer 110 is not limited thereto. The device isolation layer 110 may be formed of an insulating material, and may be formed of, for example, oxide, nitride, or a combination thereof. In an example embodiment of the present inventive concept, the device isolation layer 110 may include an insulating material, such as, for example, silicon oxide ($SiO_2$), silicon nitride ($Si_3N_4$), silicon oxynitride (SiON), or a combination thereof. As illustrated in FIG. 2, the device isolation layers 110 may have different heights on a lower portion and an external side of the first and second gate structures 160 and 170, but the shape is a shape depending on the manufacturing process, and thus, the height difference of the upper surface may be variously changed according to an example embodiment of the present inventive concept.

The channel structure 140 may include the first, second and third channel layers 141, 142 and 143, which are two or more channel layers, with three being represented here as an example, disposed on the active pattern 105 to be spaced apart from each other in a direction perpendicular to the upper surface of the active pattern 105, for example, in the Z direction. The first, second and third channel layers 141, 142 and 143 may be spaced apart from the upper surface of the active pattern 105 while being connected to the source/drain regions 150. The first, second and third channel layers 141, 142 and 143 may have a width the same as or similar to that of the active pattern 105 in the Y direction, and may have a width the same as or similar to that of the gate structure 160 in the X direction. However, according to an example embodiment of the present inventive concept, the first, second and third channel layers 141, 142 and 143 may have a reduced width such that side surfaces are positioned below the first gate structure 160 in the X direction. The first, second and third channel layers 141, 142 and 143 may be formed of a semiconductor material, and may include at least one of, for example, silicon (Si), silicon germanium (SiGe), or germanium (Ge). Alternatively, a III-V compound semiconductor may be used for the first, second and third channel layers 141, 142 and 143. The first, second and third channel layers 141, 142 and 143 may be formed of, for example, a material the same as that of the substrate 101. However, any suitable material may be used for the first, second and third channel layers 141, 142 and 143, and the material used may be different from that of the substrate 101. In an example embodiment of the present inventive concept, the number and shape of the channel layers 141, 142 and 143 constituting one channel structure 140 may be variously changed.

The source/drain regions 150 may be disposed on the active pattern 105, on both sides of the channel structure 140, and may be provided as a source region or a drain region of the transistor. The source/drain regions 150 may be disposed on respective side surfaces of the first, second and third channel layers 141, 142 and 143 of the channel structure 140, and may be disposed such that lower end portions thereof cover an upper surface of the active pattern 105. The source/drain region 150 may be disposed by partially recessing the upper portion of the active pattern 105, but the present inventive concept is not limited thereto. For example, in an example embodiment of the present inventive concept, the recess may not be formed, or the depth of the recess may be variously changed. The source/drain regions 150 may be a semiconductor layer including silicon (Si), and may be formed of an epitaxial layer. The source/drain regions 150 may include impurities having types and/or concentrations different from each other. For example, the source/drain regions 150 may include n-type doped silicon (Si) and/or p-type doped silicon germanium (SiGe). The p-type dopant may include, for example, boron (B), aluminum (Al), gallium (Ga), indium (In), or a combination thereof, and the n-type dopant may include, for example, phosphorus (P), arsenic (As), antimony (Sb), bismuth (Bi), or a combination thereof. In an example embodiment of the present inventive concept, the source/drain regions 150 may include a plurality of regions including elements and/or doping elements having concentrations different from each other. In an example embodiment of the present inventive concept, dopants may be injected in-situ into the source/drain regions 150 during a selective epitaxial growth (SEG) process for forming the source/drain regions 150. In an example embodiment of the present inventive concept, the dopants may be injected or implanted into the source/drain regions 150 after the SEG process for forming the source/drain regions 150. For example, an ion implantation process may be used to inject the dopants into the source/drain regions 150 after the SEG process.

The first gate structure 160 may be disposed to extend in one direction, for example, in the Y direction, while intersecting the active pattern 105 and the channel structures 140 on the active pattern 105 and the channel structures 140. Channel regions of transistors may be formed in the active pattern 105 and the channel structures 140 at a place where the active pattern 105 intersects the first gate structure 160. The first gate structure 160 may include the first gate electrode 165, the first gate dielectric layer 162 disposed between the first gate electrode 165 and the plurality of channel layers 141, 142 and 143, the first spacer layers 164 disposed on the side surfaces of the first gate electrode 165, and the first gate capping layer 166 disposed on the upper surface of the first gate electrode 165.

The first gate dielectric layer 162 may be disposed between the active pattern 105 and the first gate electrode 165 and between the channel structure 140 and the first gate electrode 165, and may be disposed to cover at least a portion of surfaces of the first gate electrode 165. For example, the first gate dielectric layer 162 may be disposed to surround all surfaces except an uppermost surface of the first gate electrode 165. The first gate dielectric layer 162 may extend between the first gate electrode 165 and the first spacer layers 164, but the present inventive concept is not limited thereto. The first gate dielectric layer 162 may include, for example, oxide, nitride, or a high-k material. The high-K material may refer to a dielectric material having a dielectric constant higher than that of the silicon oxide ($SiO_2$) film. The high-K material may be, for example, aluminum oxide ($Al_2O_3$), tantalum oxide ($Ta_2O_5$), titanium oxide ($TiO_2$), yttrium oxide ($Y_2O_3$), zirconium oxide ($ZrO_2$), zirconium silicon oxide ($ZrSi_xO_y$), hafnium oxide ($HfO_2$), hafnium silicon oxide ($HfSi_xO_y$), lanthanum oxide ($La_2O_3$), lanthanum aluminum oxide ($LaAl_xO_y$), lanthanum hafnium oxide ($LaHf_xO_y$), hafnium zirconium oxide ($HfZr_xO_y$), hafnium tantalum oxide ($HfTa_xO_y$), hafnium aluminum oxide ($HfAl_xO_y$), barium titanium oxide ($BaTi_xO_y$), strontium titanium oxide ($SrTi_xO_y$), or praseodymium oxide ($Pr_2O_3$). The first gate dielectric layer 162 may be formed of a single layer or may be formed of multilayers. For example, in an example embodiment of the present inventive concept, the first gate dielectric layer 162 may be formed of multilayers including at least one silicon oxide ($SiO_2$) layer and at least one high-k dielectric layer.

The first gate electrode 165 may be disposed to fill between the plurality of channel layers 141, 142 and 143, on the active pattern 105, and to extend to an upper portion of the channel structure 140, and may be spaced apart from the plurality of channel layers 141, 142 and 143 by the first gate dielectric layer 162. The first gate electrode 165 may include a conductive material, for example, a metal nitride such as, for example, titanium nitride (TiN), tantalum nitride (TaN), molybdenum nitride (MoN), niobium nitride (NbN), or tungsten nitride (WN), and/or a metal material such as, for example, aluminum (Al), titanium (Ti), tantalum (Ta), copper (Cu), tungsten (W) or molybdenum (Mo), or a semiconductor material such as, for example, doped polysilicon (p-Si). The first gate electrode 165 may be formed of two or more layers. For example, in an example embodiment of the present inventive concept, the gate electrode 165 may be formed of two layers including one metal nitride layer and one metal layer, with the metal nitride layer as a work function adjusting layer for adjusting a threshold voltage of the transistor, and the metal layer having a resistance lower than that of the metal nitride layer. Alternatively, the gate electrode 165 may be formed of two layers including one metal carbide layer and one metal layer.

The first spacer layers 164 may be disposed on both sides of the first gate electrode 165, and may extend in the Z direction perpendicular to the upper surface of the substrate 101. The first spacer layers 164 may insulate the source/drain regions 150 and the first gate electrodes 165, and may extend along the first gate electrode 165 in the second direction, for example, the Y direction. In an example embodiment of the present inventive concept, the first spacer layers 164 may also be formed in a multi-layer structure. The first spacer layers 164 may be formed of, for example, oxide, nitride, or oxynitride, and in detail, may be formed of a low dielectric constant film. For example, In an example embodiment of the present inventive concept, each of the first spacer layers 164 may have a multi-layered structure formed of at least two of a silicon oxide ($SiO_2$) layer, a silicon oxynitride (SiON) layer, a silicon oxycarbide (SiOC) layer, a silicon carbonitride (SiCN) layer, a silicon oxycarbonitride (SiOCN) layer, or a silicon nitride ($Si_3N_4$) layer.

The first gate capping layer 166 may be disposed on the first gate electrode 165, and may be disposed to extend in the second direction, for example, in the Y direction, along the upper surface of the first gate electrode 165. Side surfaces of the first gate capping layer 166 may be surrounded by the first spacer layers 164. The upper surface of the first gate capping layer 166 may be substantially coplanar with the upper surfaces of the first spacer layers 164 and the upper surfaces of the interlayer insulating layer 190 to be described later, but the present inventive concept is not limited thereto. The first gate capping layer 166 may be formed of oxide, nitride, or oxynitride, and in detail, may include at least one of, for example, silicon oxide ($SiO_2$), silicon nitride ($Si_3N_4$), silicon carbonitride (SiCN), silicon oxycarbide (SiOC), silicon oxynitride (SiON), or silicon oxycarbonitride (SiOCN).

Referring to FIGS. 1, 2, and 3 together, the semiconductor structure 120 may have second side surfaces S2 disposed adjacent to the first edge portion E1 of the active pattern 105, on the active pattern 105, and opposing each other in the second direction, for example, the Y direction. The semiconductor structure 120 may have a second edge portion E2 connected to the second side surfaces S2 and exposed toward the separation region SR. The opposite side of the second edge portion E2 of the semiconductor structure 120 may be disposed to contact the source/drain regions 150. The second edge portion E2 of the semiconductor structure 120 may be at least partially coplanar, for example, on a plane parallel to the YZ plane, with the first edge portion E1 of the active pattern 105, and the second side surfaces S2 of the semiconductor structure 120 may at least partially coplanar, for example, on a plane parallel to the XZ plane, with the first side surfaces S1 of the active pattern 105, but the present inventive concept is not limited thereto.

The semiconductor structure 120 may include first semiconductor layers 121 and second semiconductor layers 122 alternately stacked on the active pattern 105. Both the first and second semiconductor layers 121 and 122 may be disposed to be spaced apart from each other in a direction perpendicular to an upper surface of the active pattern 105, for example, in the Z direction, and may be connected to the source/drain regions 150. For example, the first semiconductor layers 121 adjacent to each other may be spaced apart from each other in the Z direction with the second semiconductor layer 122 interposed therebetween. The first and second semiconductor layers 121 and 122 alternately stacked may vertically overlap each other. The second semiconductor layers 122 may be disposed to have thicknesses and heights from the upper surface of the active pattern 105, substantially the same as those of the first, second and third channel layers 141, 142 and 143, respectively. In an example embodiment of the present inventive concept, each of the second semiconductor layers 122 is disposed at a height the same as that of each corresponding one of the first, second and third channel layers 141, 142 and 143, and is in contact with the source/drain regions 150. In an example embodiment of the present inventive concept, the second semiconductor layers 122 may be dummy channel layers that do not serve as channel layers in the transistor. The first semiconductor layers 121 may be disposed at heights substantially the same as those of the first gate electrode 165 and the first gate dielectric layer 162 disposed between the active pattern 105 and the first channel layer 141, between the first channel layer 141 and the second channel layer 142, and between the second channel layer and the third channel layer 143, respectively. In an example embodiment of the present inventive concept, the first semiconductor layers 121 may be dummy gate electrodes that do not serve as gate electrodes in the transistor. In an example embodiment of the present inventive concept, a lower surface (or a bottom surface) of a lowermost one of the first semiconductor layers 121 may be higher than an upper surface of the device isolation layer 110.

The first and second semiconductor layers 121 and 122 include a semiconductor material including at least one of, for example, silicon (Si), silicon germanium (SiGe), or germanium (Ge), but may include different materials, and may or may not include impurities. The first semiconductor layers 121 may be formed of a material having etching selectivity with respect to that of the second semiconductor layers 122. The second semiconductor layer 122 may be formed of a material the same as that of the plurality of channel layers 141, 142 and 143, or may also be formed of a material the same as that of the substrate 101.

The blocking layer 130 may be a layer covering the semiconductor structure 120, and may cover at least one of the upper surface, the second side surfaces S2, or the second edge portion E2 of the semiconductor structure 120. For example, in an example embodiment of the present inventive concept, the blocking layer 130 may cover the upper surface and the second side surfaces S2 of the semiconductor structure 120. The blocking layer 130 may cover the first side surfaces S1 of the active pattern 105 and the second side surfaces S2 of the semiconductor structure 120. In an example embodiment of the present inventive concept, the blocking layer 130 may partially cover the second side surfaces S2 of the semiconductor structure 120 or may cover the entirety of the second side surfaces S2. For example, the blocking layer 130 may extend between the first side surfaces S1 of the active pattern 105 and the second gate electrode 175, and between the second side surfaces S2 of the semiconductor structure 120 and the second gate electrode 175. The blocking layer 130 may be disposed between the semiconductor structure 120 and the second gate electrode 175 covering the semiconductor structure 120. The blocking layer 130 may have a portion covering the upper surface of the semiconductor structure 120, and a portion extending between the first edge portion E1 of the active pattern 105 and the second gate electrode 175, and between the second edge portion E2 of the semiconductor structure 120 and the second gate electrode 175. The lower portion of the blocking layer 130 may extend further downward lower than the upper surface of the semiconductor structure 120 and/or the active pattern 105 to contact the device isolation layer 110, but the present inventive concept is not limited thereto. The device isolation layer 110 may be in contact with the first side surfaces Si and the first edge portion E1 of the active pattern 105, in which a lower surface of the blocking layer 130 may be in contact with an upper surface of the device isolation layer 110. In an example embodiment of the present inventive concept, the shape, thickness, and area of the blocking layer 130 covering the semiconductor structure 120 may be variously changed. For example, the thickness of the blocking layer 130 covering the second side surfaces S2 of the semiconductor structure 120 and the thickness of the blocking layer 130 covering the second edge portion E2 of the semiconductor structure 120 may be the same as or different from each other. The thickness of the blocking layer 130 covering the upper surface of the semiconductor structure 120 may be relatively thin.

According to an example embodiment of the present inventive concept, when the semiconductor device is a FinFET transistor, the semiconductor structure 120 may be a portion of the active pattern 105 or may be a portion of the source/drain regions 150. For example, the semiconductor structure 120 may not include first semiconductor layers 121 and second semiconductor layers 122 alternately stacked on the active pattern 105. In this case, the blocking layer 130 may cover the active pattern 105 or the source/drain regions 150.

The blocking layer 130 may include a semiconductor material such as, for example, silicon (Si), germanium (Ge), silicon carbide (SiC), or silicon germanium (SiGe). In an example embodiment of the present inventive concept, the blocking layer 130 may be formed of oxide, nitride, or oxynitride, and in detail, may include at least one of, for example, silicon oxide ($SiO_2$), silicon nitride ($Si_3N_4$), silicon carbonitride (SiCN), silicon oxycarbide (SiOC), silicon oxynitride (SiON), or silicon oxycarbonitride (SiOCN), but the present inventive concept is not limited thereto. The blocking layer 130 may include a material different from that of the first semiconductor layers 121, and may include a material the same as that of the second semiconductor layers 122. The blocking layer 130 may include a material having an etch selectivity with respect to that of the first semiconductor layers 121 and/or that of the second semiconductor layers 122, and for example, the first semiconductor layers 121 may include silicon germanium (SiGe) and the blocking layer 130 may include silicon (Si). In an example embodiment of the present inventive concept, the blocking layer 130 may include an epitaxial layer grown from the semiconductor structure 120, or may also be formed of a plurality of layers doped with impurities in different concentrations. The blocking layer 130 may be an epitaxial layer grown from the semiconductor structure 120, and impurities may be injected in-situ into the blocking layer 130 during a selective epitaxial growth (SEG) process for forming the blocking layer 130.

The blocking layer 130 may be a layer that protects the semiconductor structure 120 and the source/drain regions 150 during the gate replacement process. In the separation region SR, the second side surfaces S2 and/or the second edge portion E2 of the semiconductor structure 120 are exposed, but since the blocking layer 130 covers the semiconductor structure 120, the blocking layer 130 may prevent the source/drain regions 150 adjacent to the separation region SR from being damaged when a sacrificial gate electrode layer is removed in a process to be described later and the first semiconductor layer 121 and/or the second semiconductor layer 122 are removed together if not covered. For example, the sacrificial gate electrode layer to be described may have an etch selectivity with respect to the blocking layer 130, and the blocking layer 130 may not be etched by the etchant used in etching the sacrificial gate electrode layer to be described, as a result, the semiconductor structure 120 covered by the blocking layer 130 may be prevented from being etched. Thus, a semiconductor device having enhanced reliability may be provided.

The second gate structure 170 may be disposed to extend in one direction, for example, in the Y direction, while intersecting the active pattern 105 and the semiconductor structure 120 on the active pattern 105 and the semiconductor structure 120. The second gate structure 170 may include a second gate electrode 175, a second gate dielectric layer 172 disposed between the second gate electrode 175 and the semiconductor structure 120, second spacer layers 174 disposed on side surfaces of the second gate electrode 175, and a second gate capping layer 176 disposed on the upper surface of the second gate electrode 175. In the case in which technical features of the second gate structure 170 are the same as those of the first gate structure 160, the descriptions thereof will be omitted, and differences will be mainly described.

The second gate dielectric layer 172 may be disposed between the blocking layer 130 and the second gate electrode 175, may cover the upper and side surfaces of the blocking layer 130, and may have a portion further downwardly extending lower than the upper surface of the semiconductor structure 120 or the upper surface of the active pattern 105, between the blocking layer 130 and the second gate electrode 175. Accordingly, in the second gate dielectric layer 172, the portion that is disposed between the blocking layer 130 and the second gate electrode 175 may further downwardly extend lower than the semiconductor structure 120, for example, lower than the lower surface of the semiconductor structure 120. The lower surface of the second gate dielectric layer 172 may contact the upper surface of the device isolation layer 110. The second gate dielectric layer 172 may be disposed between the second gate electrode 175 and the device isolation layer 110, but the present inventive concept is not limited thereto.

The second spacer layers 174 may be disposed on both sides of the second gate electrode 175, and may contact an upper portion of the blocking layer 130. The second spacer layers 174 are illustrated as being in contact with the blocking layer 130 through the inner surface, but the present inventive concept is not limited thereto. For example, the lower surfaces of the second spacer layers 174 may be in contact with the upper surface of the blocking layer 130, or the second spacer layers 174 may not be in contact with the blocking layer 130. At least one of the second spacer layers 174 may be in contact with the semiconductor structure 120. At least one of the second spacer layers 174 may further downwardly extend lower than the upper surface of the semiconductor structure 120 or the upper surface of the active pattern 105, and at least one of lower surfaces of the second spacer layers 174 may be in contact with the device isolation layer 110 in the separation region SR. Accordingly, at least one of the second spacer layers 174 may further extend to be lower than the semiconductor structure 120, for example, lower than the lower surface of the semiconductor structure 120. However, the present inventive concept is not limited thereto.

The second gate electrode 175 may cover the first edge portion E1 of the active pattern 105 and the second edge portion E2 of the semiconductor structure 120. For example, the second gate electrode 175 may include a portion vertically overlapping the first edge portion E1 of the active pattern 105 and the second edge portion E2 of the semiconductor structure 120. The second gate electrode 175 may cover at least a portion of the semiconductor structure 120, and may include a portion that extends further downward lower than the upper surface of the semiconductor structure 120 or the upper surface of the active pattern 105. In an example embodiment of the present inventive concept, the second gate electrode 175 may be a dummy gate electrode that does not function as a gate electrode in the transistor.

The interlayer insulating layer 190 may be disposed to cover the upper surfaces of the device isolation layers 110, the source/drain regions 150, and the first and second gate structures 160 and 170. The interlayer insulating layer 190 may be disposed between the second gate structures 170 in the separation region SR. The interlayer insulating layer 190 may include at least one of, for example, oxide, nitride, or oxynitride, and may include a low dielectric constant material. In an example embodiment of the present inventive concept, the interlayer insulating layer 190 may include a silicon oxide ($SiO_2$) layer.

The contact plug 180 may penetrate through the interlayer insulating layer 190 to be connected to the source/drain region 150, and may apply an electrical signal to the source/drain region 150. The contact plug 180 may have a bar shape extending in the Y direction when viewed in a plan view, and may be disposed on the source/drain region 150 as illustrated in FIG. 1, for example, having a length in the Y direction smaller than that of the source/drain region 150. However, the present inventive concept is not limited thereto. For example, in an example embodiment of the present inventive concept, the contact plug 180 may be disposed to have a length longer in the Y direction than that of the source/drain region 150. The contact plug 180 may have an inclined side surface in which the width of the lower portion becomes narrower than the width of the upper portion depending on the aspect ratio, but the present inventive concept is not limited thereto. The contact plug 180 may extend from an upper portion to a portion, for example, to be lower than the third channel layer 143, and may be recessed to a height corresponding to that of an upper surface of the second channel layer 142, but the present inventive concept is not limited thereto. In an example embodiment of the present inventive concept, the contact plug 180 may also be disposed to contact along the upper surface of the source/drain region 150 without recessing the source/drain region 150. For example, the lower surface of the contact plug 180 may be formed on a plane the same as that of the upper surface of the source/drain region 150. The contact plug 180 may include, for example, a metal nitride material such as, for example, titanium nitride (TiN), tantalum nitride (TaN), molybdenum nitride (MoN), niobium nitride (NbN), or tungsten nitride (WN), and/or a metal material such as, for example, aluminum (Al), titanium (Ti), tantalum (Ta), copper (Cu), tungsten (W), or molybdenum (Mo).

Next, a semiconductor device according to an example embodiment of the present inventive concept will be described with reference to each of FIGS. 4 to 10. The same description as that described above with reference to FIGS. 1 and 2 will be omitted. Differences from the semiconductor device shown in FIGS. 1 and 2 will be mainly described.

Figure 4:
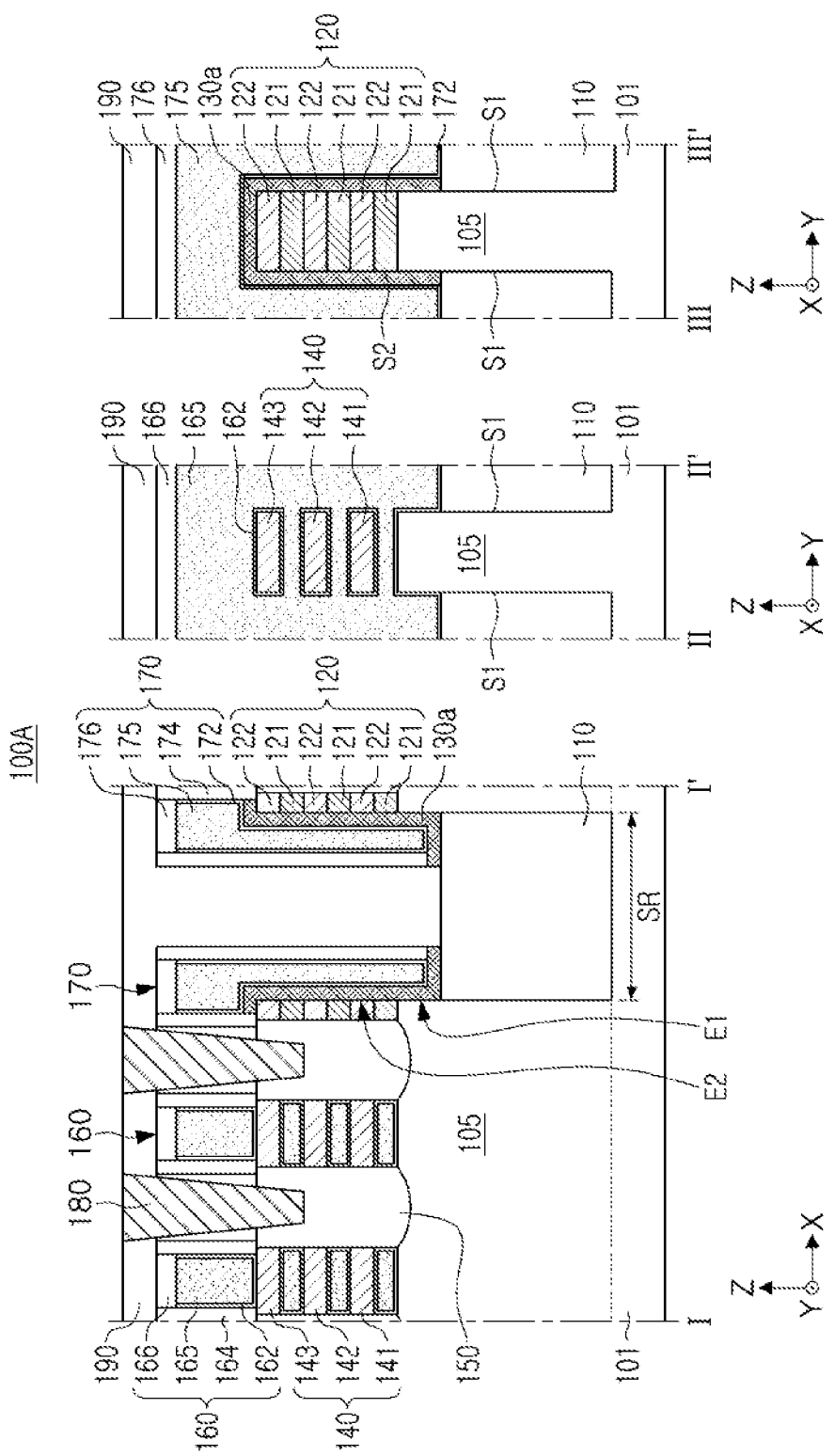
FIGS. 4 to 8, 9A to 9C and 10 are cross-sectional views each illustrating a semiconductor device according to an example embodiment of the present inventive concept.

FIG. 4 is a cross-sectional view illustrating a semiconductor device according to an example embodiment of the present inventive concept. FIG. 4 illustrates regions corresponding to cross-sections taken along lines I-I', II-II' and III-III' of FIG. 1.

Referring to FIG. 4, in a semiconductor device 100A, a lower portion of a blocking layer 130a may cover a portion of a lower surface of the second gate electrode 175. The blocking layer 130a may extend downwardly from above the second edge portion E2 of the semiconductor structure 120 to the first edge portion E1 of the active pattern 105 to contact the device isolation layer 110. The blocking layer 130a may include an extension portion extending in parallel with the upper surface of the substrate 101 in the first direction, for example, the X direction. The extension portion may be disposed below a lowermost surface of the second gate electrode 175 and may contact the lower surface of at least one of the second spacer layers 174. The blocking layer 130a may be formed to have a shape to be partially recessed after the blocking layer 130a is formed to cover an upper surface, a side surface, and an edge portion of the semiconductor structure 120, and may cover an upper surface of the device isolation layer 110 in the separation region SR by a deposition process.

Since the blocking layer 130a covers the semiconductor structure 120, the blocking layer 130a may prevent the source/drain regions 150 adjacent to the separation region SR from being damaged by preventing the semiconductor structure 120 being etched during a process of removing a sacrificial gate electrode layer to be described. Thus, the semiconductor device 100A having enhanced reliability may be provided.

Figure 5:
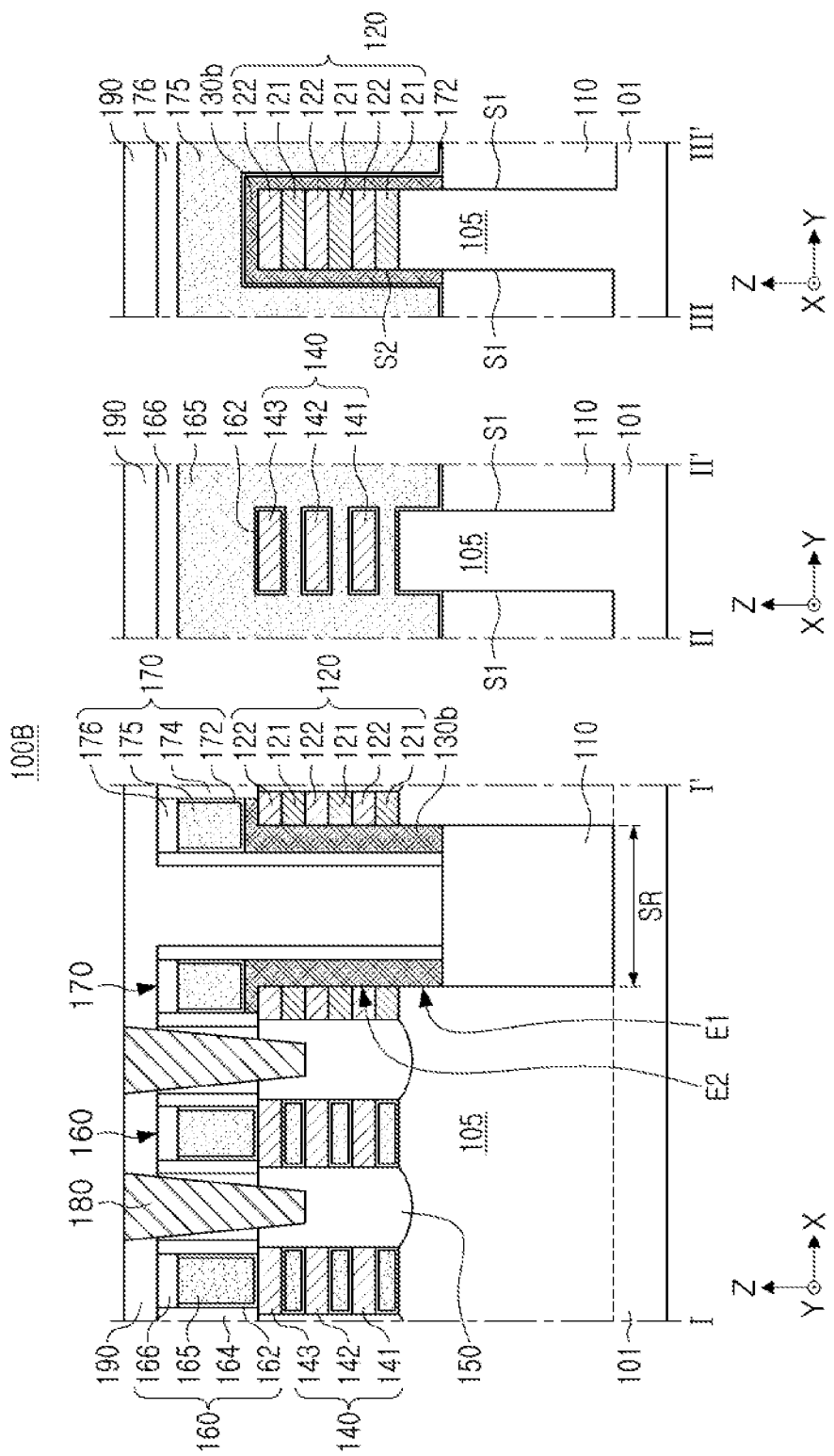

FIG. 5 is a cross-sectional view illustrating a semiconductor device according to an example embodiment of the present inventive concept. FIG. 5 illustrates regions corresponding to cross-sections taken along lines I-I', II-II' and III-III' of FIG. 1.

Referring to FIG. 5, comparing to the example embodiment described above with reference to FIG. 2, a semiconductor device 100B may be configured in such a manner that a surface of the blocking layer 130 disposed on the opposite side of the surface of the blocking layer 130b covering the second edge portion E2 of the semiconductor structure 120 may contact the second spacer layer 174. For example, the second gate electrode 175 may not include a portion that extends further downward lower than the upper surface of the semiconductor structure 120 or the upper surface of the active pattern 105. The blocking layer 130b may extend from the second side surfaces S2 and the second edge portion E2 of the semiconductor structure 120 toward the second spacer layers 174 to contact the second spacer layers 174. The blocking layer 130b may be disposed to fill an area between the semiconductor structure 120 and the inner wall of the second spacer layers 174 facing the second edge portion E2 of the semiconductor structure 120. The second gate dielectric layer 172 and the second gate electrode 175 may not be formed between the blocking layer 130b and the inner wall of the second spacer layers 174 facing the second edge portion E2 of the semiconductor structure 120.

The width of the blocking layer 130b between the semiconductor structure 120 and the second spacer layers 174 in the X direction may be relatively great, and the blocking layer 130b may protect the semiconductor structure 120 and the source/drain regions 150 adjacent to the separation region SR. Since the blocking layer 130b having a great width in the X direction covers the semiconductor structure 120 and protects the semiconductor structure 120 and the source/drain regions 150, the semiconductor device 100B having enhanced reliability may be provided. According to an example embodiment of the present inventive concept, a first width of the semiconductor structure 120 in the X direction and a second width of the blocking layer 130b in the X direction may be variously changed, and the ratio of the first width to the second width may also be variously changed.

Figure 6:
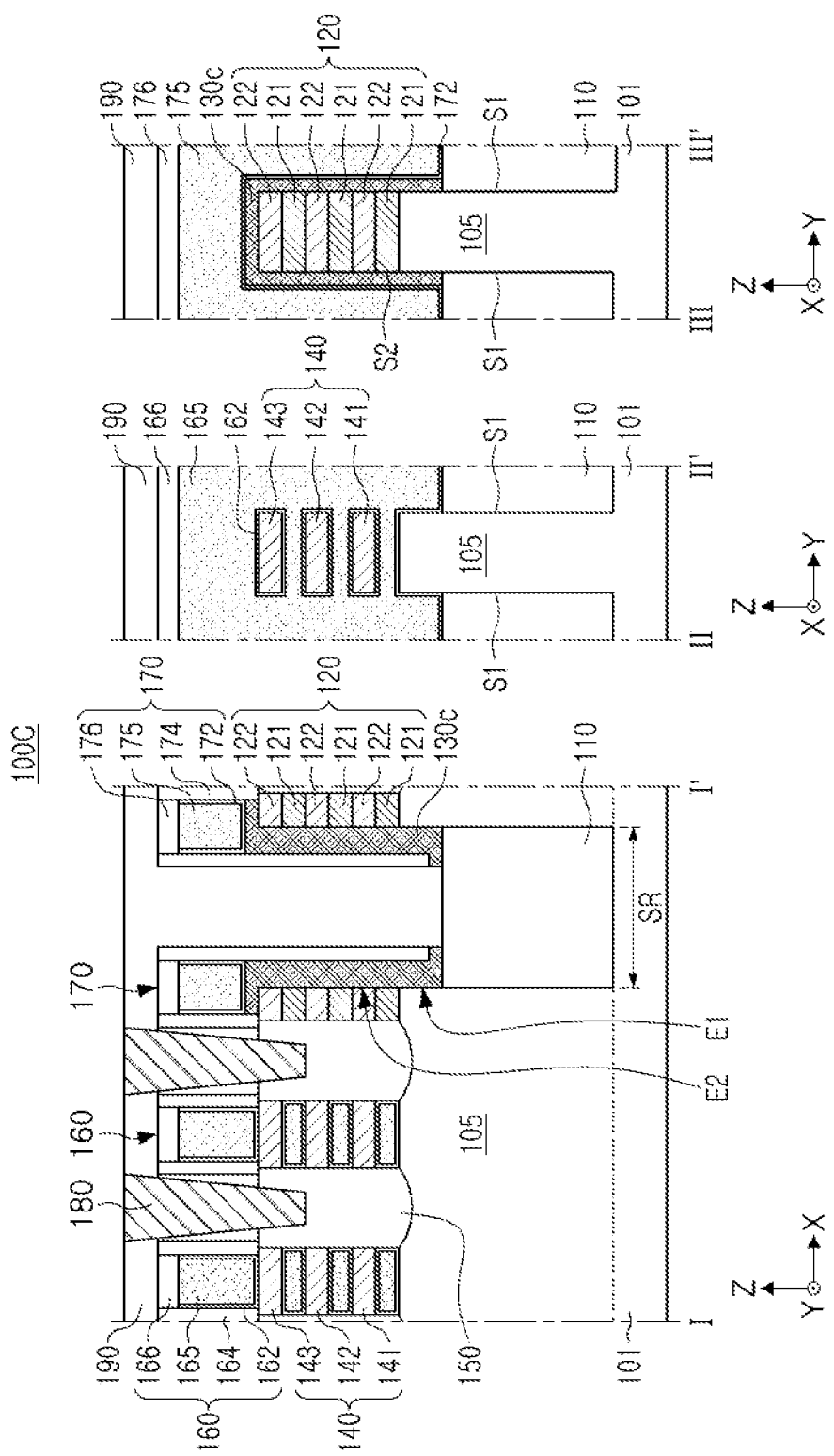

FIG. 6 is a cross-sectional view illustrating a semiconductor device according to an example embodiment of the present inventive concept. FIG. 6 illustrates regions corresponding to cross-sections taken along lines I-I', II-II' and III-III' of FIG. 1.

Referring to FIG. 6, a semiconductor device 100C may include an extension portion of the blocking layer 130C extending parallel to the upper surface of the substrate 101 in the first direction, for example, in the X direction, comparing to the blocking layer 130b illustrated in the example embodiment described above with reference to FIG. 5. The extension portion may contact a lower surface of at least one of the second spacer layers 174. The blocking layer 130c may be formed to have a shape, in which the upper surface, the side surface and the edge portion of the semiconductor structure 120 are covered by the blocking layer 130c in the deposition process, and the upper surface of the device isolation layer 110 is covered in the separation region SR by the formation of the blocking layer 130c, and then the blocking layer is partially recessed. Since the blocking layer 130c covers the semiconductor structure 120, the blocking layer 130c may prevent the source/drain regions 150 adjacent to the separation region SR from being damaged by preventing the semiconductor structure 120 being etched during a process of removing a sacrificial gate electrode layer to be described. Thus, the semiconductor device 100C having enhanced reliability may be provided.

Figure 7:
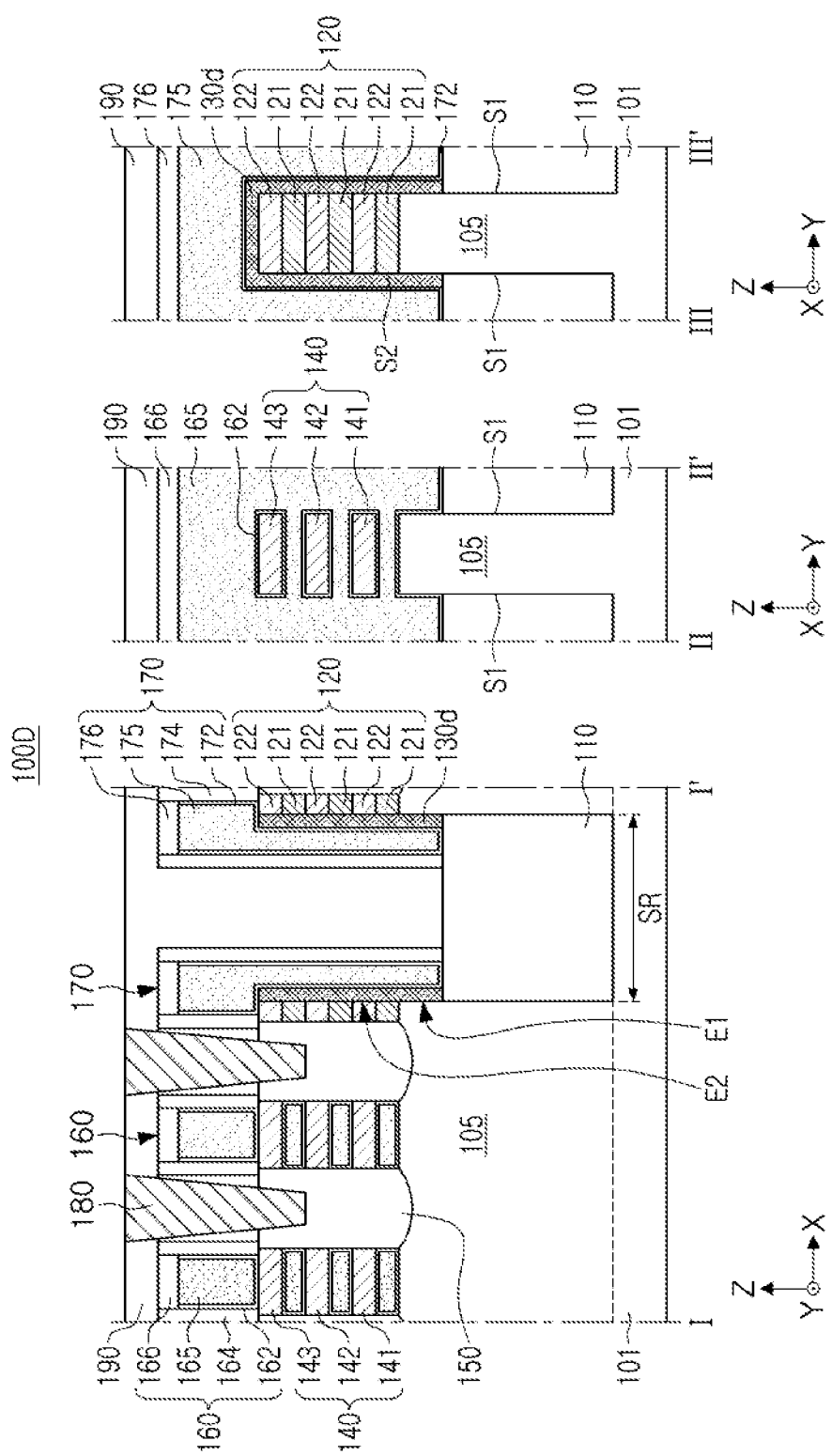

FIG. 7 is a cross-sectional view illustrating a semiconductor device according to an example embodiment of the present inventive concept. FIG. 7 illustrates regions corresponding to cross-sections taken along lines I-I', II-II' and III-III' of FIG. 1.

Referring to FIG. 7, comparing to the example embodiment described above with reference to FIG. 2, a semiconductor device 100D may be configured in such a manner that a blocking layer 130d does not cover the upper surface of the semiconductor structure 120, but may cover the first edge portion E1 and the first side surfaces S1 of the active pattern 105 and the second edge portion E2 and the second side surfaces S2 of the semiconductor structure 120. In an example embodiment of the present inventive concept, the blocking layer 130d does not cover the upper surface of the semiconductor structure 120, and may be disposed to fill an area between the semiconductor structure 120 and the inner wall of the second spacer layers 174 facing the second edge portion E2 of the semiconductor structure 120. Since the blocking layer 130d covers the semiconductor structure 120, the blocking layer 130d may prevent the source/drain regions 150 adjacent to the separation region SR from being damaged by preventing the semiconductor structure 120 being etched during a process of removing a sacrificial gate electrode layer to be described. Thus, the semiconductor device 100D having enhanced reliability may be provided.

Figure 8:
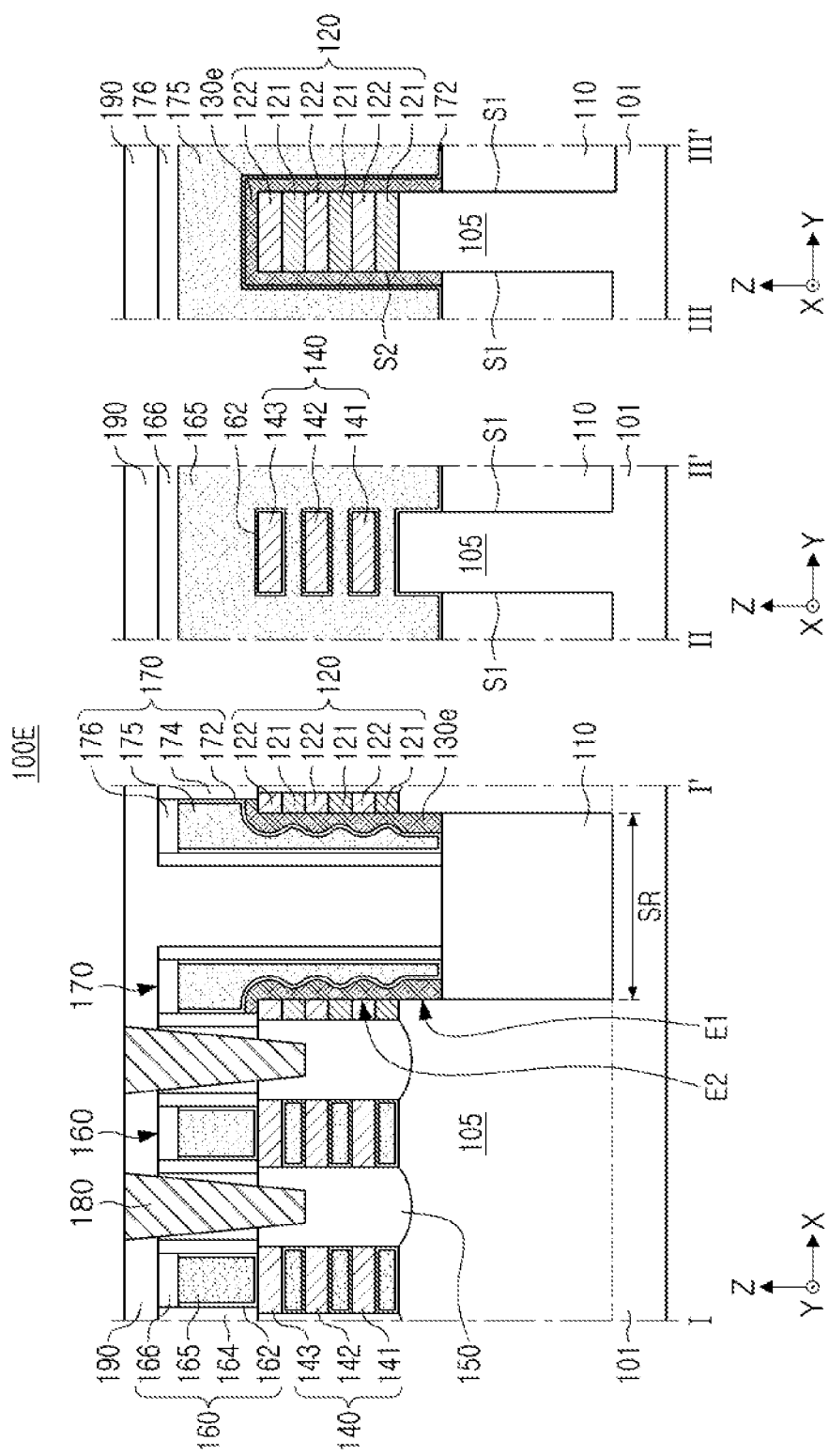

FIG. 8 is a cross-sectional view illustrating a semiconductor device according to an example embodiment of the present inventive concept. FIG. 8 illustrates regions corresponding to cross-sections taken along lines I-I', and of FIG. 1.

Referring to FIG. 8, comparing to the example embodiment described above with reference to FIG. 2, a semiconductor device 100E may be configured in such a manner that an opposite side surface of a surface of a blocking layer 130e contacting the second edge portion E2 of the semiconductor structure 120 may have a concavo-convex shape. The blocking layer 130e may be an epitaxial layer grown from the semiconductor structure 120, and may have a difference in growth rate at different portions of the semiconductor structure 120, due to different materials included in the first semiconductor layers 121 and the second semiconductor layers 122. For example, when the first semiconductor layers 121 include silicon germanium (SiGe) and the second semiconductor layers 122 include silicon (Si), the growth rate of silicon (Si) in the second semiconductor layers 122 may be faster than that of silicon (Si) in the first semiconductor layers 121. Accordingly, a portion of the blocking layer 130e adjacent to the first semiconductor layers 121 may protrude relatively outward to have a convex shape, and a portion of the blocking layer 130e adjacent to the second semiconductor layers 122 does not relatively protrude outward to have a shape that is concave inwardly toward the second semiconductor layers 122. However, the shape of the blocking layer 130e may be changed depending on the epitaxial layer growth process conditions, and thus is not limited to the shape illustrated in FIG. 8. Since the blocking layer 130e covers the semiconductor structure 120, the blocking layer 130e may prevent the source/drain regions 150 adjacent to the separation region SR from being damaged by preventing the semiconductor structure 120 being etched during a process of removing a sacrificial gate electrode layer to be described. Thus, the semiconductor device 100E having enhanced reliability may be provided.

Figure 9A:
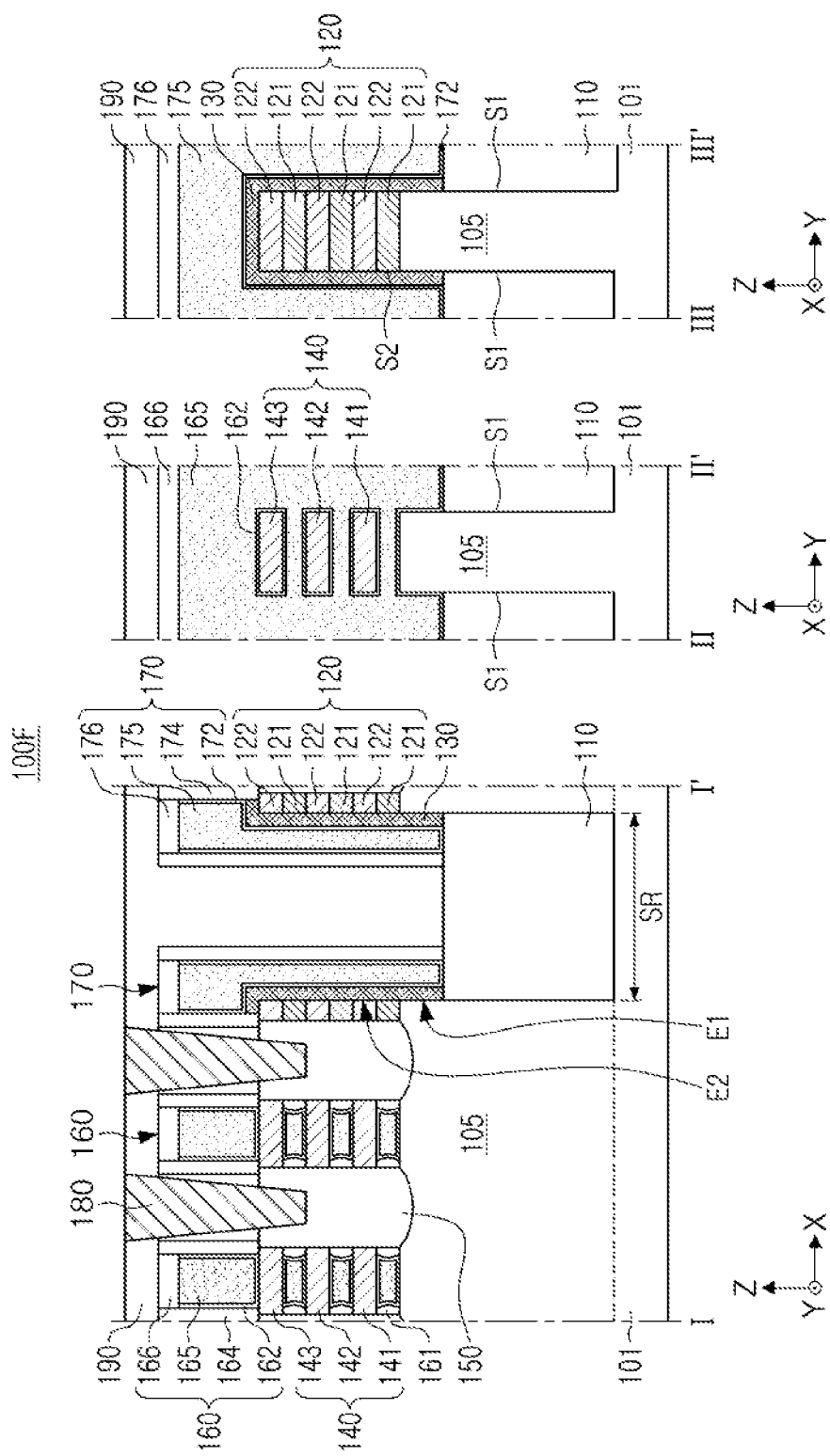

FIG. 9A is a cross-sectional view illustrating a semiconductor device according to an example embodiment of the present inventive concept. FIG. 9A illustrates regions corresponding to cross-sections taken along lines I-I', II-II' and III-III' of FIG. 1.

Referring to FIG. 9A, comparing to the example embodiment described above with reference to FIG. 2, a semiconductor device 100F may be configured in such a manner that the first gate structures 160 may further include internal spacer layers 161. The internal spacer layers 161 may be disposed in parallel with the first gate electrode 165, between the channel structures 140, and may be disposed on both sides of the first gate structure 160 in the first direction, for example, the X direction, on lower surfaces of the first, second and third channel layers 141, 142 and 143, respectively. The internal spacer layers 161 may have external surfaces substantially coplanar with external surfaces of the first, second and third channel layers 141, 142 and 143. On the lower portion of the third channel layer 143, the first gate electrode 165 may be separated from the source/drain regions 150 by the internal spacer layers 161, to be electrically separated therefrom. Similarly, the first gate electrodes 165 may be separated from the source/drain regions 150 by the internal spacer layers 161 disposed on the lower portion of the second channel layer 142, and by the internal spacer layers 161 disposed on the lower portion of the first channel layer 141. The internal spacer layers 161 may have a shape in which a side facing the first gate electrode 165 is convexly rounded toward the first gate electrode 165 to be convex inwardly, but the present inventive concept is not limited thereto. The internal spacer layers 161 may be formed of, for example, oxide, nitride, or oxynitride, and in detail, may be formed of a low dielectric constant film. In an example embodiment of the present inventive concept, the internal spacer layers 161 may include, for example, silicon nitride ($Si_3N_4$), silicon carbonitride (SiCN), silicon boron nitride (SiBN), silicon oxynitride (SiON), silicon oxycarbonitride (SiOCN), silicon boron carbonitride (SiBCN), silicon oxycarbide (SiOC), silicon oxide ($SiO_2$), or a combination thereof. In an exemplary embodiment of the present inventive concept, the internal spacer layers 161 may each include an air gap. The internal spacer layers 161 are not limited to the example embodiment of FIG. 9A, and the semiconductor device in another example embodiment may further include the internal spacer layers 161. For example, semiconductor devices 100A to 100E described above may each include the internal spacer layers 161.

Figure 9B:
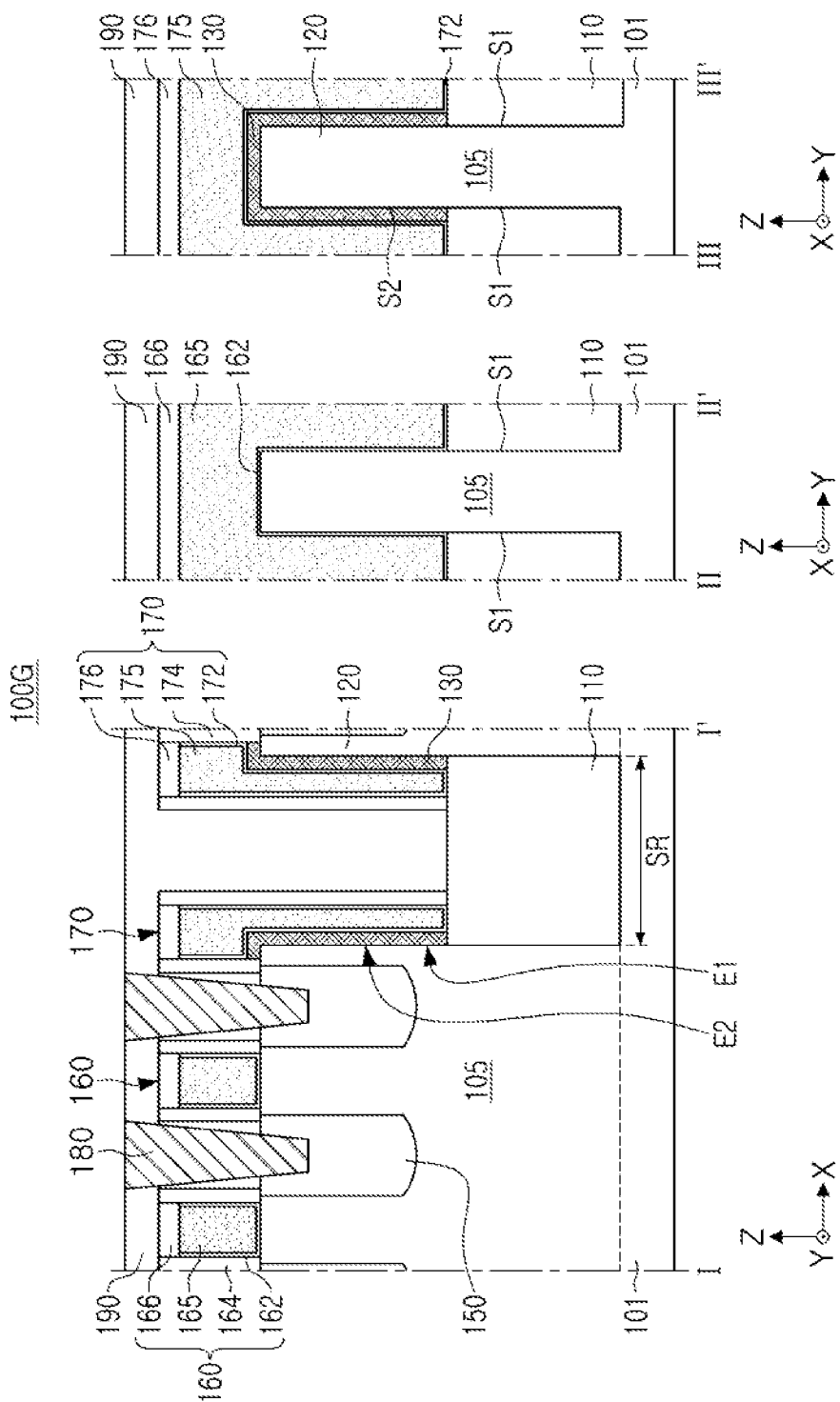

FIG. 9B is a cross-sectional view illustrating a semiconductor device according to an example embodiment of the present inventive concept. FIG. 9B illustrates regions corresponding to cross-sections taken along lines I-I', II-II' and III-III' of FIG. 1.

FIG. 9B illustrates cross-sections of a semiconductor device 100G including a FinFET, in which the first gate structure 160 surrounds three surfaces of the active pattern 105, for example, an upper surface of the active pattern 105 and side surfaces thereof in the Y direction. Comparing to the example embodiment of FIG. 2, the semiconductor device 100G may not include a plurality of channel layers, and a channel region of the transistor may be formed in the active pattern 105 intersecting the first gate structure 160.

In this example embodiment, the semiconductor structure 120 may be disposed to be adjacent to the separation region SR, on the active pattern 105, and may form a continuous structure with the active pattern 105. The semiconductor structure 120 may also be understood as a region of the active pattern 105 intersecting the second gate structure 170. The blocking layer 130 may cover at least one of the upper and side surfaces of the semiconductor structure 120. Since the blocking layer 130 covers the semiconductor structure 120, the blocking layer 130 may prevent the source/drain regions 150 adjacent to the separation region SR from being damaged by preventing the semiconductor structure 120 being etched during a process of removing a sacrificial gate electrode layer to be described. Thus, the semiconductor device 100G having enhanced reliability may be provided.

Figure 9C:
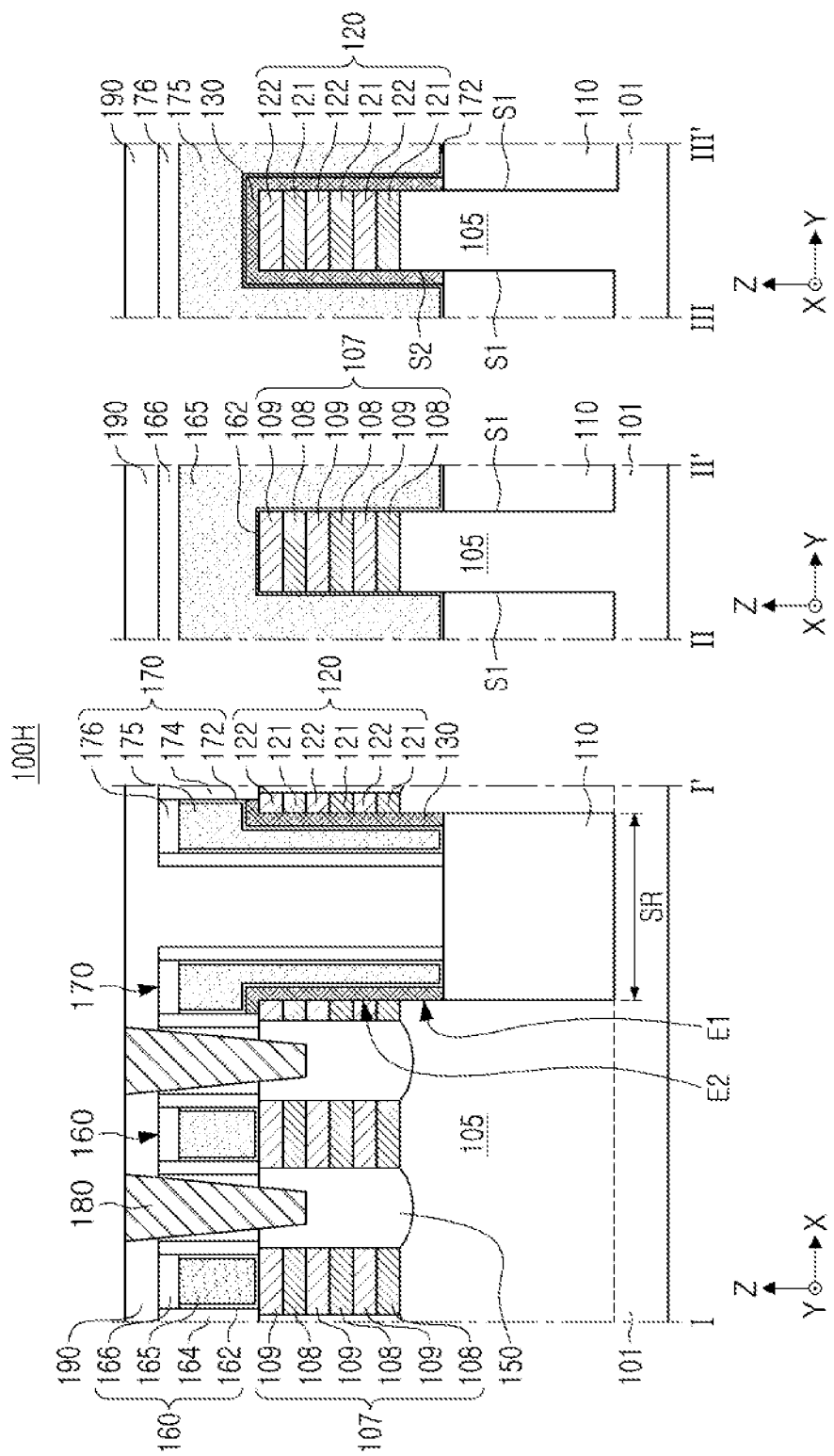

FIG. 9C is a cross-sectional view illustrating a semiconductor device according to an example embodiment of the present inventive concept. FIG. 9C illustrates regions corresponding to cross-sections taken along lines I-I', II-II' and III-III' of FIG. 1.

Referring to FIG. 9C, comparing to the example embodiment described above with reference to FIG. 9B, a semiconductor device 100H, which includes a FinFET, may include a fin structure 107 between source/drain regions 150, on the active pattern 105. The fin structure 107 may include a plurality of first silicon germanium layers 108 and a plurality of first silicon layers 109, and may be provided as a channel region of the transistor. The semiconductor device 100H may include a semiconductor structure 120 adjacent to the separation region SR, on the active pattern 105, and the semiconductor structure 120 may include first semiconductor layers 121 and second semiconductor layers 122 alternately stacked.

The plurality of first silicon germanium layers 108 and the plurality of first silicon layers 109 may be alternately stacked on the active pattern 105. Both the plurality of first silicon germanium layers 108 and the plurality of first silicon layers 109 may be disposed to be spaced apart from each other in the Z direction, and may be connected to the source/drain regions 150 in the X direction. For example, the first silicon germanium layers 108 adjacent to each other may be spaced apart from each other in the Z direction with the first silicon layer 109 interposed therebetween. The plurality of first silicon germanium layers 108 and the plurality of first silicon layers 109 alternately stacked may vertically overlap each other. A lowermost first silicon germanium layer 108 of the plurality of first silicon germanium layers 108 may contact the active pattern 105.

The semiconductor structure 120 may include first semiconductor layers 121 and second semiconductor layers 122 alternately stacked on the active pattern 105. Both the first and second semiconductor layers 121 and 122 may be disposed to be spaced apart from each other in a direction perpendicular to an upper surface of the active pattern 105, for example, in the Z direction, and may be connected to the source/drain regions 150 in the X direction. For example, the first semiconductor layers 121 adjacent to each other may be spaced apart from each other in the Z direction with the second semiconductor layer 122 interposed therebetween. The first and second semiconductor layers 121 and 122 alternately stacked may vertically overlap each other. The first and second semiconductor layers 121 and 122 may include a semiconductor material including at least one of silicon (Si), silicon germanium (SiGe), or germanium (Ge), but may include different materials, and may or may not include impurities. For example, the first semiconductor layers 121 may include silicon germanium (SiGe), and the second semiconductor layers 122 may include silicon (Si). The blocking layer 130 may cover at least one of the upper and side surfaces of the semiconductor structure 120. Since the blocking layer 130 covers the semiconductor structure 120, the blocking layer 130 may prevent the source/drain regions 150 adjacent to the separation region SR from being damaged by preventing the semiconductor structure 120 being etched during a process of removing a sacrificial gate electrode layer to be described. Thus, the semiconductor device 100H having enhanced reliability may be provided.

In an example embodiment of the present inventive concept, the semiconductor device described above with reference to FIGS. 9B and 9C may be co-located with the semiconductor device including MBCFET™ described above in a different example embodiment. For example, the semiconductor device may include first and second transistor regions, the first transistor region may include the FinFET described above with reference to FIGS. 9B and/or 9C, and the second transistor region may include MBCFET™ described above with reference to FIGS. 1 to 9A.

Figure 10:
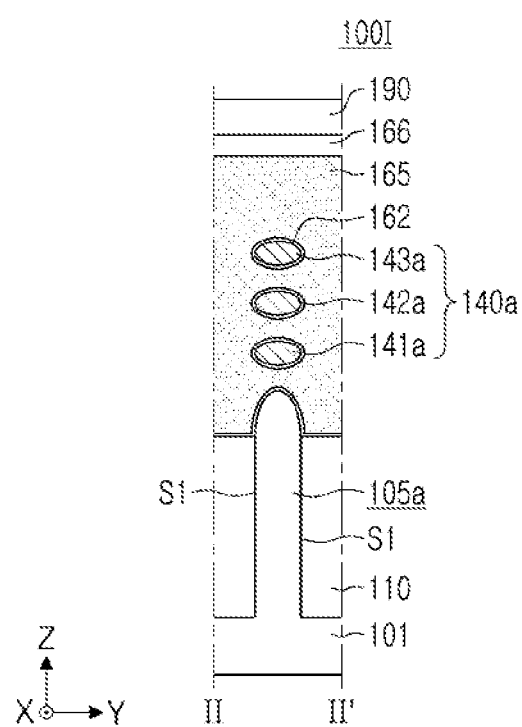

FIG. 10 is a cross-sectional view illustrating a semiconductor device according to an example embodiment of the present inventive concept. FIG. 10 illustrates a region corresponding to a cross-section taken along line II-II' of FIG. 1.

Referring to FIG. 10, in the case of a semiconductor device 100I, the width of an active pattern 105a and the width of a channel structure 140a may be different from those of the example embodiment of FIG. 2. The active pattern 105a and the channel structure 140a may have a relatively small width, and accordingly, a plurality of channel layers 141a, 142a and 143a of the channel structure 140a may have a circular shape, or an elliptical shape having a relatively small difference in length between the major axis and the minor axis, in each cross section in the Y direction. The active pattern 105 may have a round top under the plurality of channel layers 141a, 142a and 143a of the channel structure 140a. For example, in the example embodiment of FIG. 2, the plurality of channel layers 141, 142 and 143 may have a width of about 20 nm to 50 nm in the Y direction, and the plurality of channel layers 141a, 142a and 143a of this embodiment may have a width of about 3 nm to 12 nm in the Y direction. As such, in an example embodiment of the present inventive concept, the width of the active pattern 105a and the channel structure 140a and the shape thereof may be variously changed.

FIGS. 11A to 19B are diagrams according to a process sequence to describe a method of manufacturing a semiconductor device according to an example embodiment of the present inventive concept. FIGS. 11A to 19B illustrate an example embodiment of a method of manufacturing the semiconductor device of FIG. 2.

Figure 11A:
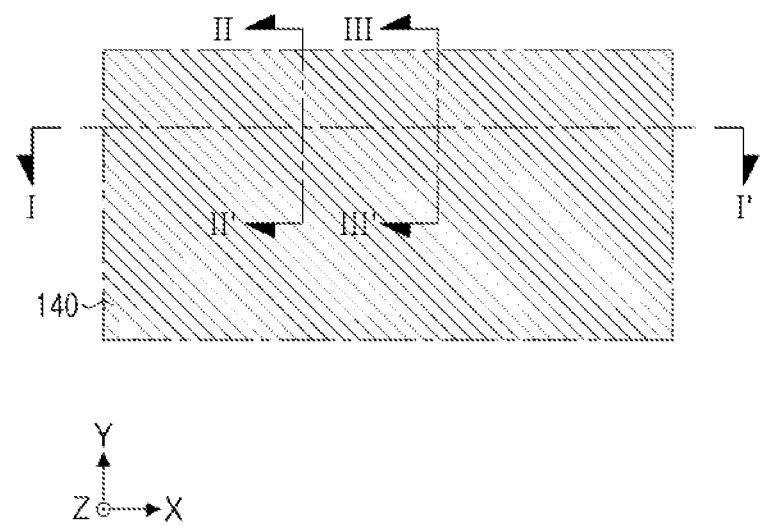
FIGS. 11A to 11B, 12A to 12B, 13A to 13B, 14A to 14D, 15A to 15B, 16A to 16C, 17A to 17B, 18A to 18B, and 19A to 19B are diagrams according to a process sequence to describe a method of manufacturing a semiconductor device according to an example embodiment of the present inventive concept.
Figure 11B:
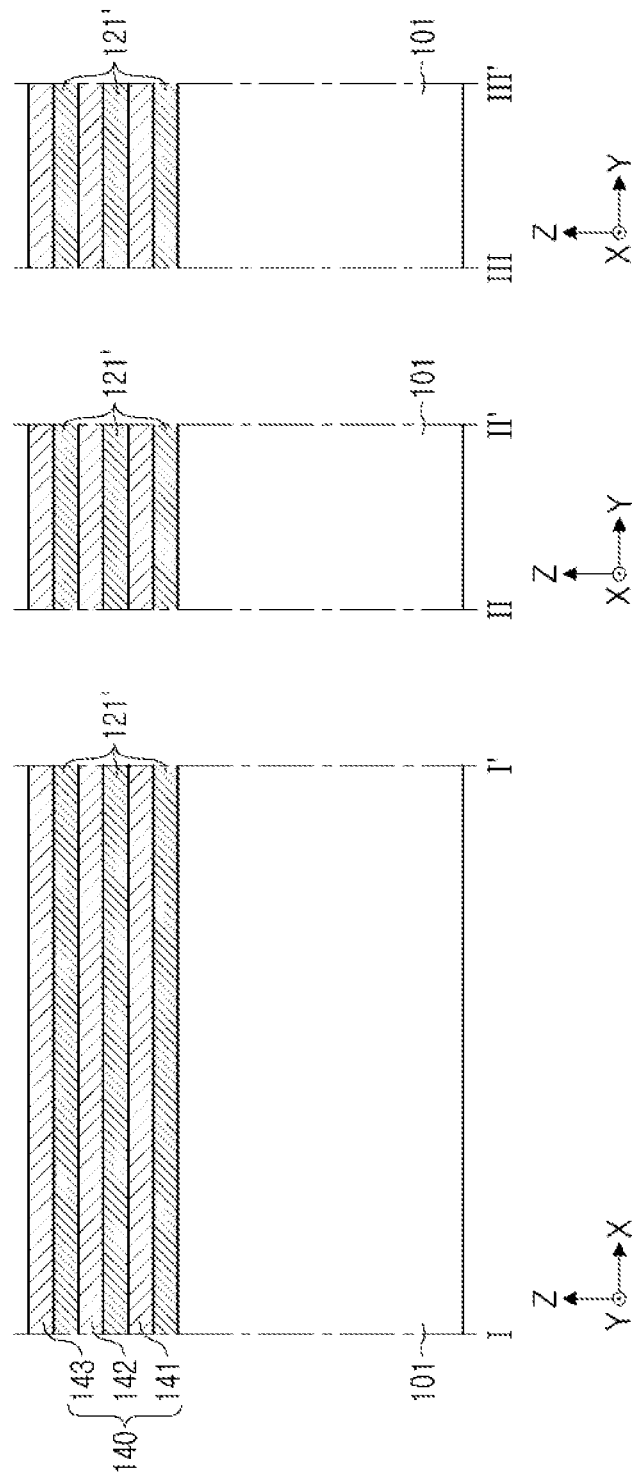

Referring to FIGS. 11A and 11B, sacrificial layers 121' and channel layers 141, 142 and 143 may be alternately stacked on the substrate 101.

The sacrificial layers 121' may each be a layer that is replaced by the first gate dielectric layer 162 and the first gate electrode 165 through a subsequent process, and a portion thereof may be the layer remaining as the first semiconductor layer 121 of the semiconductor structure 120. Some of the channel layers 141, 142 and 143 may be the same layers as the second semiconductor layers 122 of the semiconductor structure 120 as illustrated in FIG. 2. The sacrificial layers 121' may be formed of a material having etching selectivity with respect to a material of the channel layers 141, 142 and 143. The channel layers 141, 142 and 143 may include a material different from that of the sacrificial layers 121'. The sacrificial layers 121' and the channel layers 141, 142 and 143 may include, for example, a semiconductor material including at least one of silicon (Si), silicon germanium (SiGe), or germanium (Ge), but may contain different materials, or may or may not contain impurities. For example, the sacrificial layers 121' may include silicon germanium (SiGe), and the channel layers 141, 142 and 143 may include silicon (Si).

The sacrificial layers 121' and the channel layers 141, 142 and 143 may be formed by performing an epitaxial growth process using the substrate 101 as a seed. Each of the sacrificial layers 121' and the channel layers 141, 142 and 143 may have a thickness in a range from about 1 Å to about 100 nm. In an example embodiment of the present inventive concept, the number of layers of the channel layers 141, 142 and 143 alternately stacked with the sacrificial layer 121' may be variously changed.

Figure 12A:
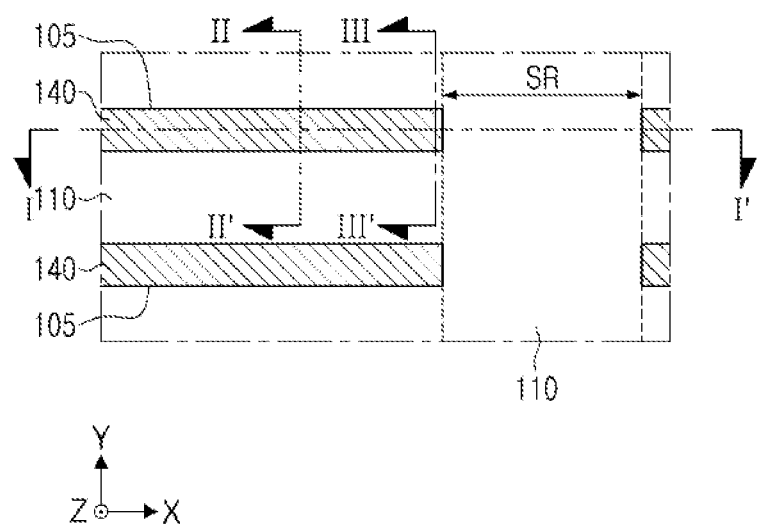
Figure 12B:
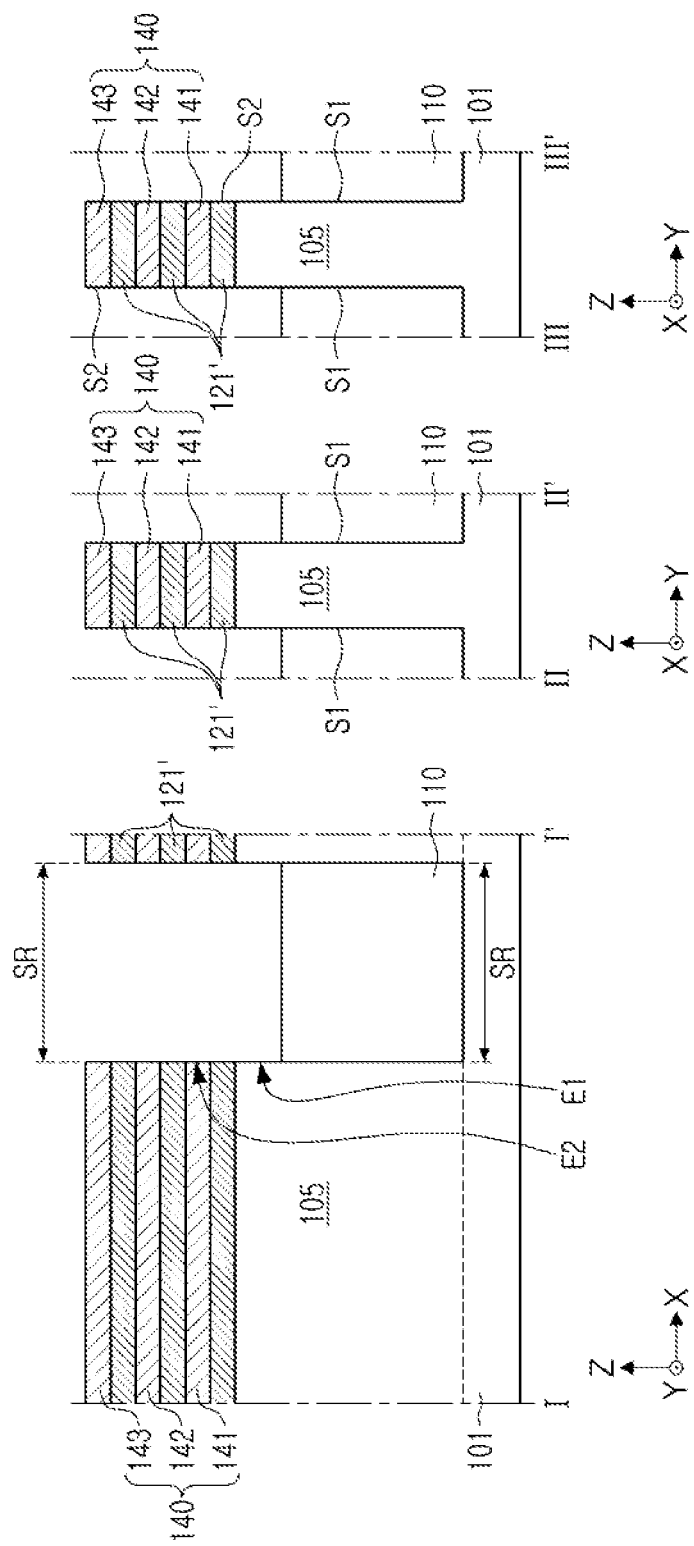

Referring to FIGS. 12A and 12B, active structures may be formed by patterning the stacked structure of the sacrificial layers 121' and the channel layers 141, 142 and 143 and by removing a portion of the substrate 101.

The active structure may include the sacrificial layers 121' and the channel layers 141, 142 and 143 alternately stacked. An active pattern 105 may be formed to protrude from the upper surface of the substrate 101 by removing a portion of the substrate 101. The active structures may be formed in a linear shape extending in one direction, for example, in the X direction, and may be disposed to be spaced apart from each other in the Y direction. Both the active structures and the active patterns 105 may be disposed to be spaced apart from each other at a predetermined distance in the X direction, and a region from which a portion of the substrate 101 is removed so that the active structures and the active patterns 105 are spaced apart from each other in the X direction may be defined as a separation region SR. The active structures and the active pattern 105 may be divided into a plurality of regions by the separation region SR. A region disposed adjacent to the separation region SR among the active structures may be a region having a structure the same as that of the semiconductor structure 120 as illustrated in FIG. 2.

The active pattern 105 may protrude from the upper surface of the substrate 101 to have first side surfaces S1 and a first edge portion E1 connected to the first side surfaces S1. As a portion of the substrate 101 is removed, the first side surfaces S1 and the first edge portion E1 of the active pattern 105 may be exposed.

In the region in which a portion of the substrate 101 is removed, the device isolation layers 110 may be formed by filling and recessing an insulating material so that the active pattern 105 protrudes. The upper surface of the device isolation layers 110 may be formed to be lower than the upper surface of the active pattern 105. Thus, the upper portion of the active pattern 105 may vertically protrude upward from the upper surface of the device isolation layers 110.

Figure 13A:
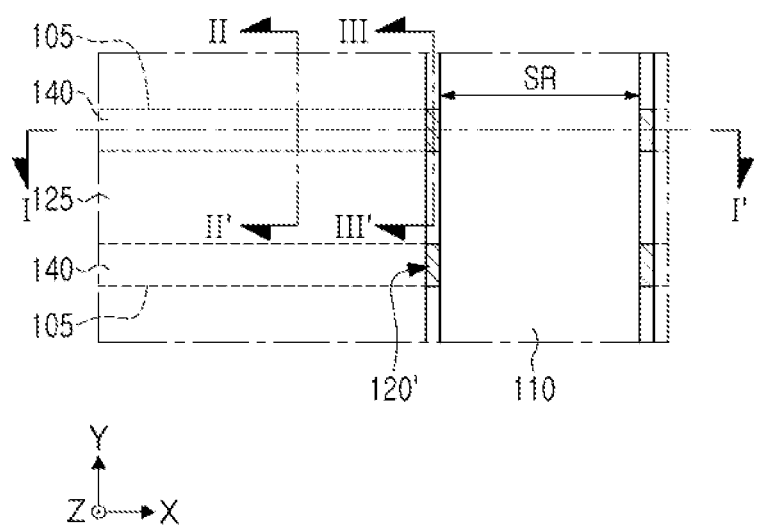
Figure 13B:
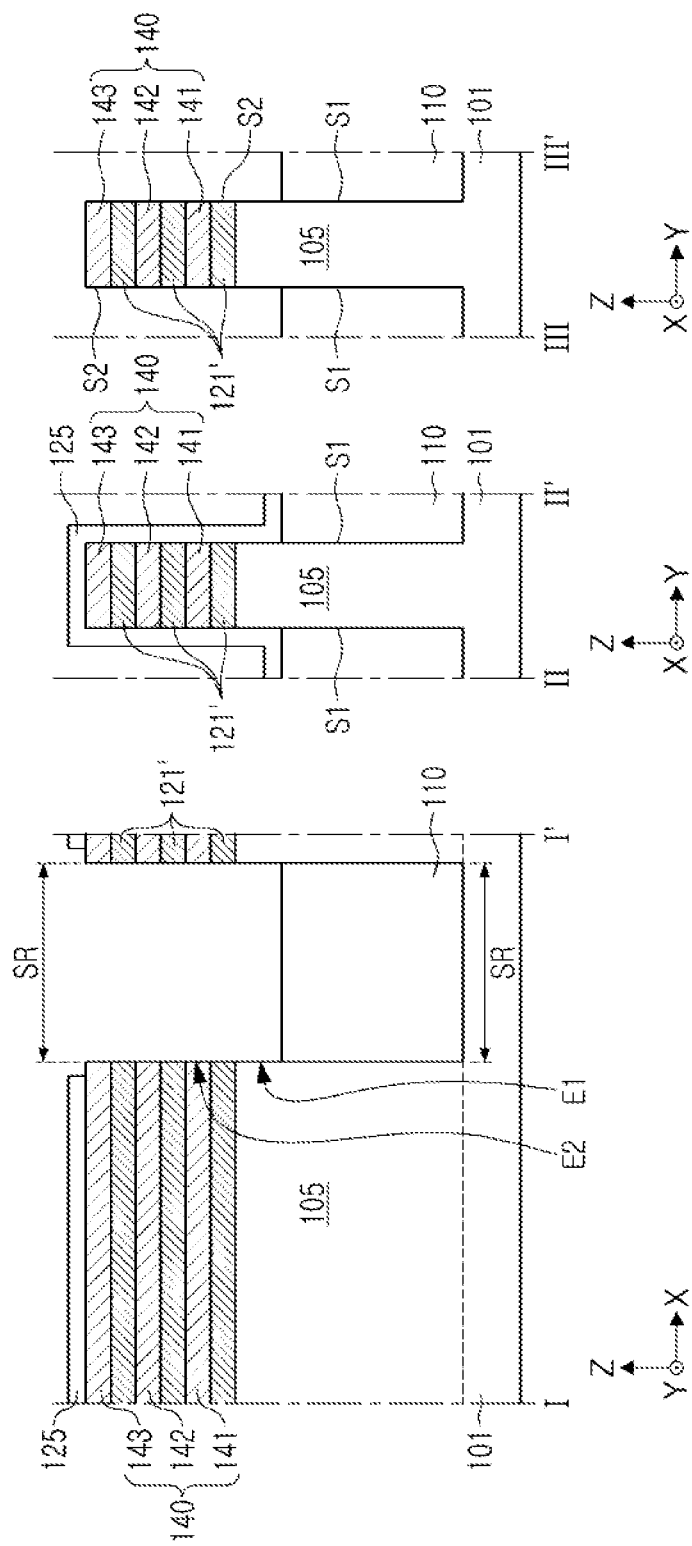

Referring to FIGS. 13A and 13B, a mask layer 125 may be formed to cover the active pattern 105, the active structure and the device isolation layer 110.

The mask layer 125 may cover the upper and side surfaces of the active structure, but may not cover a portion of the active structure adjacent to the separation region SR. The portion of the active structure not covered by the mask layer 125 may be a region in which a semiconductor structure to be described later is to be formed. The mask layer 125 may cover a portion of the first side surfaces Si of the active pattern 105, and may cover a portion of the upper surface of the device isolation layer 110 extending in the Y direction, between the active patterns 105. The mask layer 125 may be formed of, for example, oxide, nitride, or oxynitride, and in detail, may include at least one of, for example, silicon oxide ($SiO_2$), silicon nitride ($Si_3N_4$), silicon carbonitride (SiCN), silicon oxycarbide (SiOC), silicon oxynitride (SiON), or silicon oxycarbonitride (SiOCN), but the present inventive concept is not limited thereto.

Figure 14A:
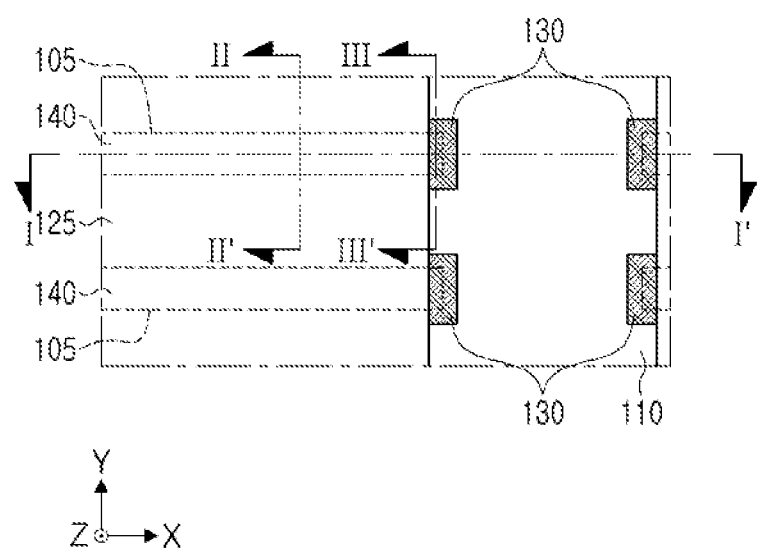
Figure 14B:
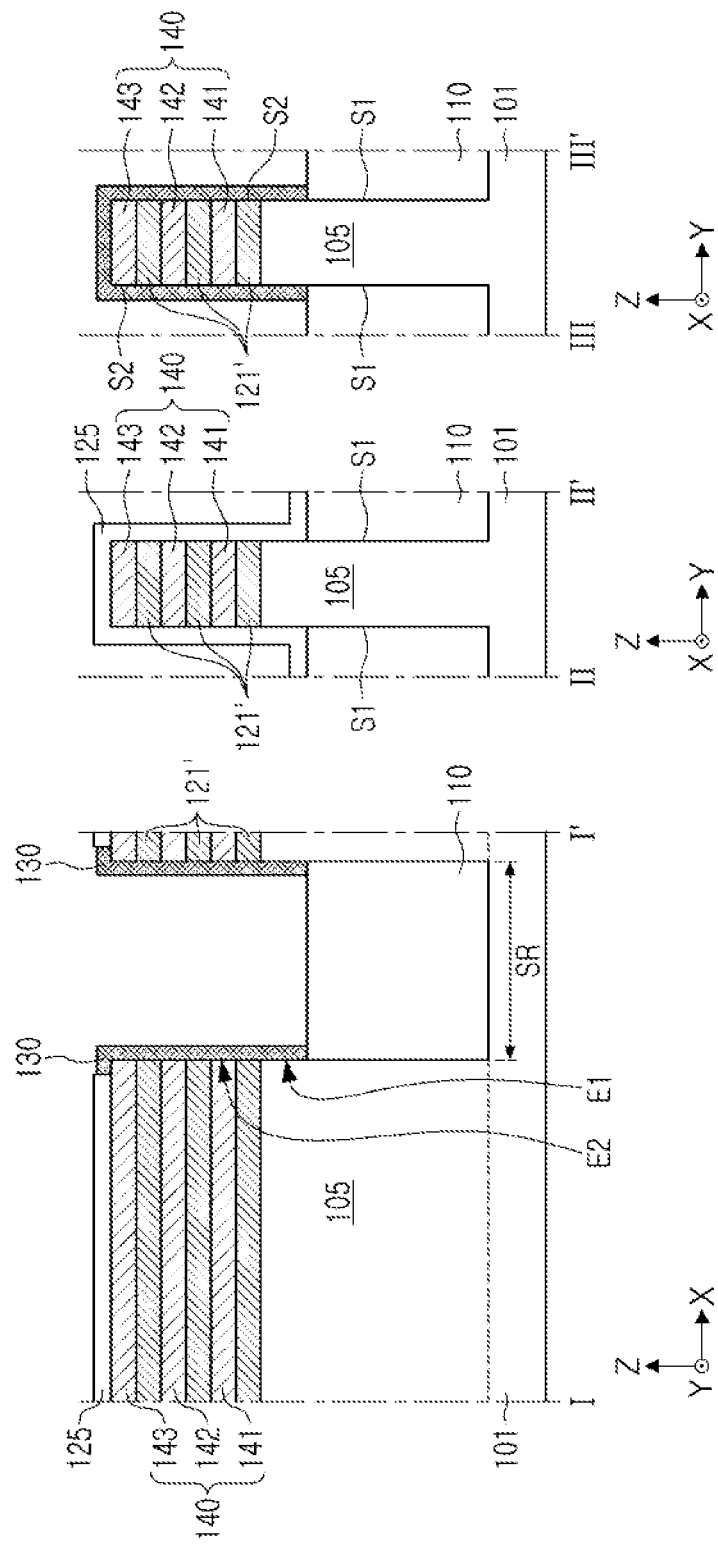

Referring to FIGS. 14A and 14B, a blocking layer 130 may be formed to cover an exposed area of the active structure and an exposed area of the active pattern 105.

The blocking layer 130 may cover the exposed ends and sides of the channel layers 141, 142 and 143, and may be formed to cover the exposed ends and sides of the sacrificial layers 121'. The upper portion of the blocking layer 130 may cover a portion of the upper surface of the third channel layer 143, and the lower portion of the blocking layer 130 may extend downward lower than the upper surface of the active pattern 105 to cover the side surfaces of the active pattern 105 and contact the upper surface of the device isolation layer 110. The blocking layer 130 may be formed to conformally cover the active pattern 105 and the active structure.

The blocking layer 130 may be formed by performing an epitaxial growth process using the portion of the active pattern 105 protruding above the upper surface of the device isolation layer 110, the channel layers 141, 142 and 143, and the sacrificial layers 121' as seeds. In an example embodiment of the present inventive concept, the blocking layer 130 may be a layer in which silicon (Si) is grown as an epitaxial layer. In an example embodiment of the present inventive concept, the blocking layer 130 may be formed by an atomic layer deposition (ALD) process or a chemical vapor deposition (CVD) process.

Figure 14C:
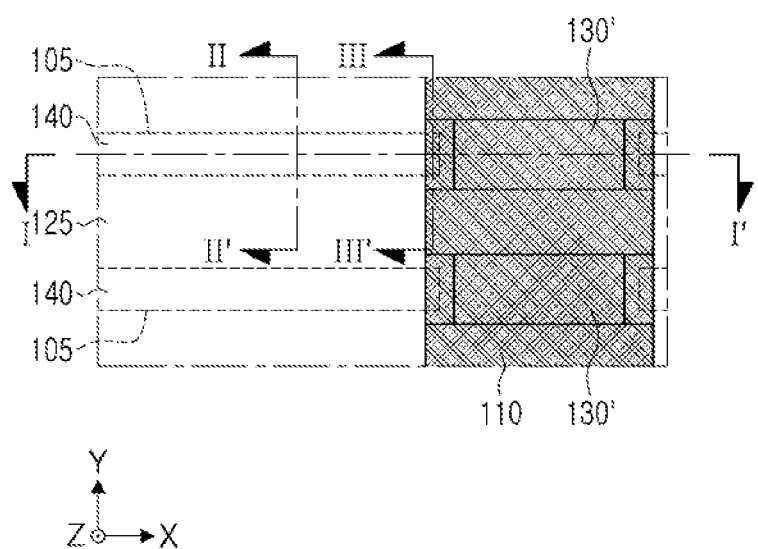
Figure 14D:
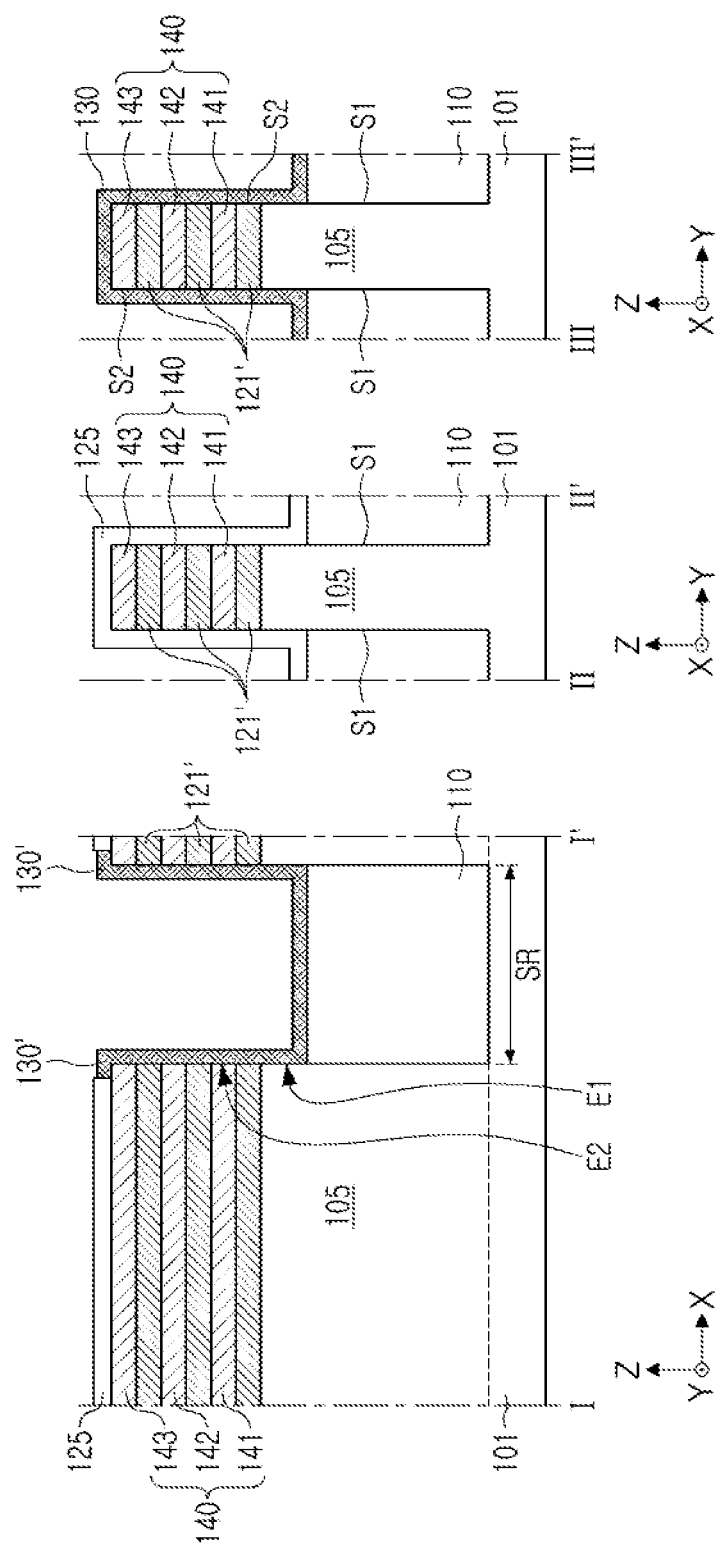

Referring to FIGS. 14C and 14D, according to an example embodiment of the present inventive concept, the preliminary blocking layer 130' may be formed to completely cover an area not covered by the mask layer 125. The entirety of an upper surface of the device isolation layers 110 that are not covered by the mask layer 125 may be covered by the preliminary blocking layer 130'. The preliminary blocking layer 130' may cover one ends and side surfaces of the channel layers 141, 142 and 143, and may cover one ends and side surfaces of the sacrificial layers 121'. Subsequently, a portion of the preliminary blocking layer 130' covering the upper surface of the device isolation layer 110 in the separation region SR may be recessed to form the blocking layer 130a or the blocking layer 130c having the extension portion of FIG. 4 or the extension of FIG. 6, respectively.

Figure 15A:
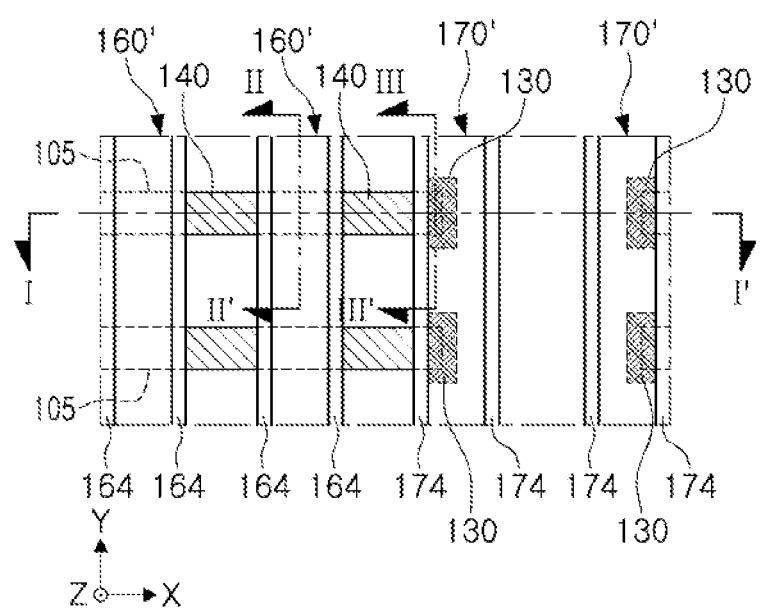
Figure 15B:
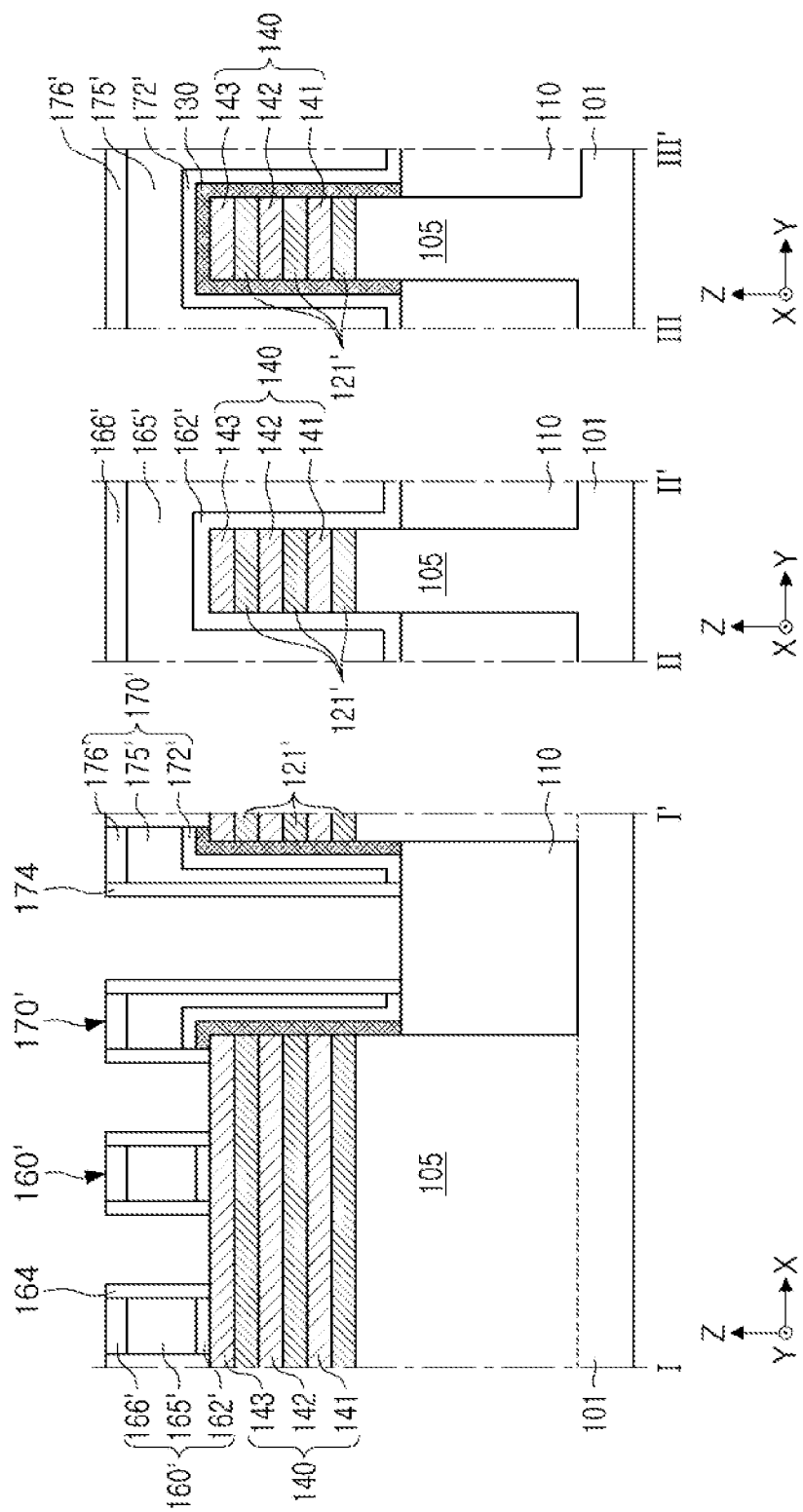

Referring to FIGS. 15A and 15B, the mask layer 125 is removed, and first sacrificial gate structures 160', first spacer layers 164, second sacrificial gate structures 170' and second spacer layers 174 may be formed on the active structures.

The first sacrificial gate structure 160' may be a sacrificial structure on the channel structures 140, formed in a region in which the first gate dielectric layer 162 and the first gate electrode 165 are disposed through a subsequent process as illustrated in FIG. 2. The first sacrificial gate structure 160' may include first and second sacrificial gate layers 162' and 165' sequentially stacked, and a first gate mask pattern layer 166'. The first and second sacrificial gate layers 162' and 165' may be patterned using the first gate mask pattern layer 166', for example, as an etch mask in an etching process. The first and second sacrificial gate layers 162' and 165' may be an insulating layer and a conductive layer, respectively, but the present inventive concept is not limited thereto, and, for example, the first and second sacrificial gate layers 162' and 165' may be formed of one layer. For example, the first sacrificial gate layer 162' may include silicon oxide ($SiO_2$), and the second sacrificial gate layer 165' may include polysilicon (p-Si). The first gate mask pattern layer 166' may include silicon oxide ($SiO_2$) and/or silicon nitride ($Si_3N_4$). The first sacrificial gate structures 160' may have a linear shape that intersects the active structures and extends in one direction. The first sacrificial gate structures 160' may extend, for example, in the Y direction and may be spaced apart from each other in the X direction.

The first spacer layers 164 may be formed on both side walls of the first sacrificial gate structures 160'. The first spacer layers 164 may be formed by conformally forming a first spacer film having a uniform thickness along the upper and side surfaces of the first sacrificial gate structures 160' and the active structures, followed by anisotropic etching. To form the first spacer film, a process such as, for example, an atomic layer deposition (ALD) process, a chemical vapor deposition (CVD) process, or a combination thereof may be used. The first spacer layers 164 may be formed of a low dielectric constant material, and may include, for example, at least one of silicon oxide ($SiO_2$), silicon nitride ($Si_3N_4$), silicon carbonitride (SiCN), silicon oxycarbide (SiOC), silicon oxynitride (SiON), or silicon oxycarbonitride (SiOCN). In an example embodiment of the present inventive concept, the first spacer layers 164 may be formed of a multi-layer including at least two of a silicon oxide ($SiO_2$) layer, a silicon nitride ($Si_3N_4$) layer, a silicon carbonitride (SiCN) layer, a silicon oxycarbide (SiOC) layer, a silicon oxynitride (SiON) layer, or a silicon oxycarbonitride (SiOCN) layer.

The second sacrificial gate structure 170' may be a sacrificial structure formed in a region on the semiconductor structure 120, in which the second gate dielectric layer 172 and the second gate electrode 175 are disposed as illustrated in FIG. 2 through a subsequent process. The second sacrificial gate structure 170' may include third and fourth sacrificial gate layers 172' and 175' sequentially stacked, and a second gate mask pattern layer 176'. The third and fourth sacrificial gate layers 172' and 175' may be patterned using the second gate mask pattern layer 176', for example, as an etch mask in an etching process. In describing the second sacrificial gate structures 170', a description of the same portions as the first sacrificial gate structures 160' will be omitted. On the other hand, the third and fourth sacrificial gate layers 172' and 175' may be respectively formed to extend toward the upper surface of the device isolation layer 110, between the blocking layer 130 and the second spacer layers 174. The third sacrificial gate layer 172' may be formed to cover the upper and side surfaces of the blocking layer 130.

The second spacer layers 174 may be formed on both side walls of the second sacrificial gate structures 170'. The same description as the first spacer layers 164 will be omitted. At least one of the second spacer layers 174 may be formed to extend further downwardly lower than the upper surface of the active pattern 105, and a lower surface of at least one of the second spacer layers 174 may be in contact with the device isolation layer 110 in the separation region SR, but the present inventive concept is not limited thereto.

Figure 16A:
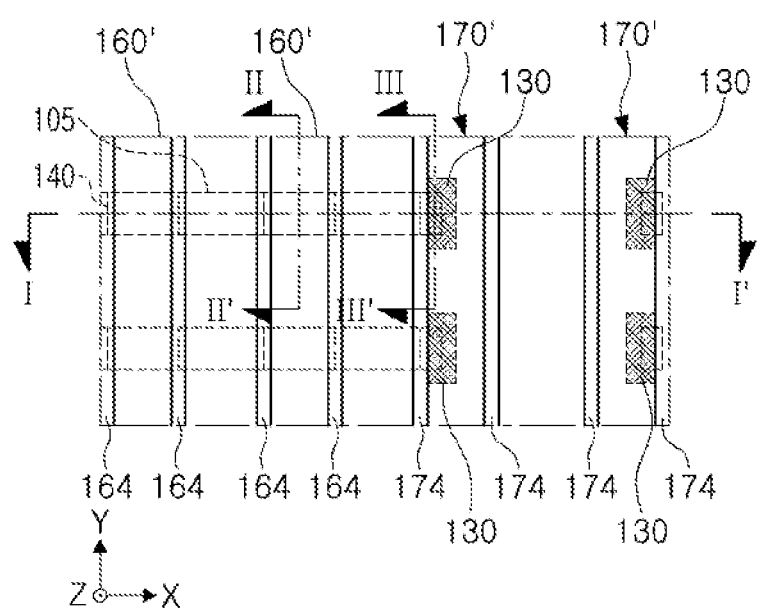
Figure 16B:
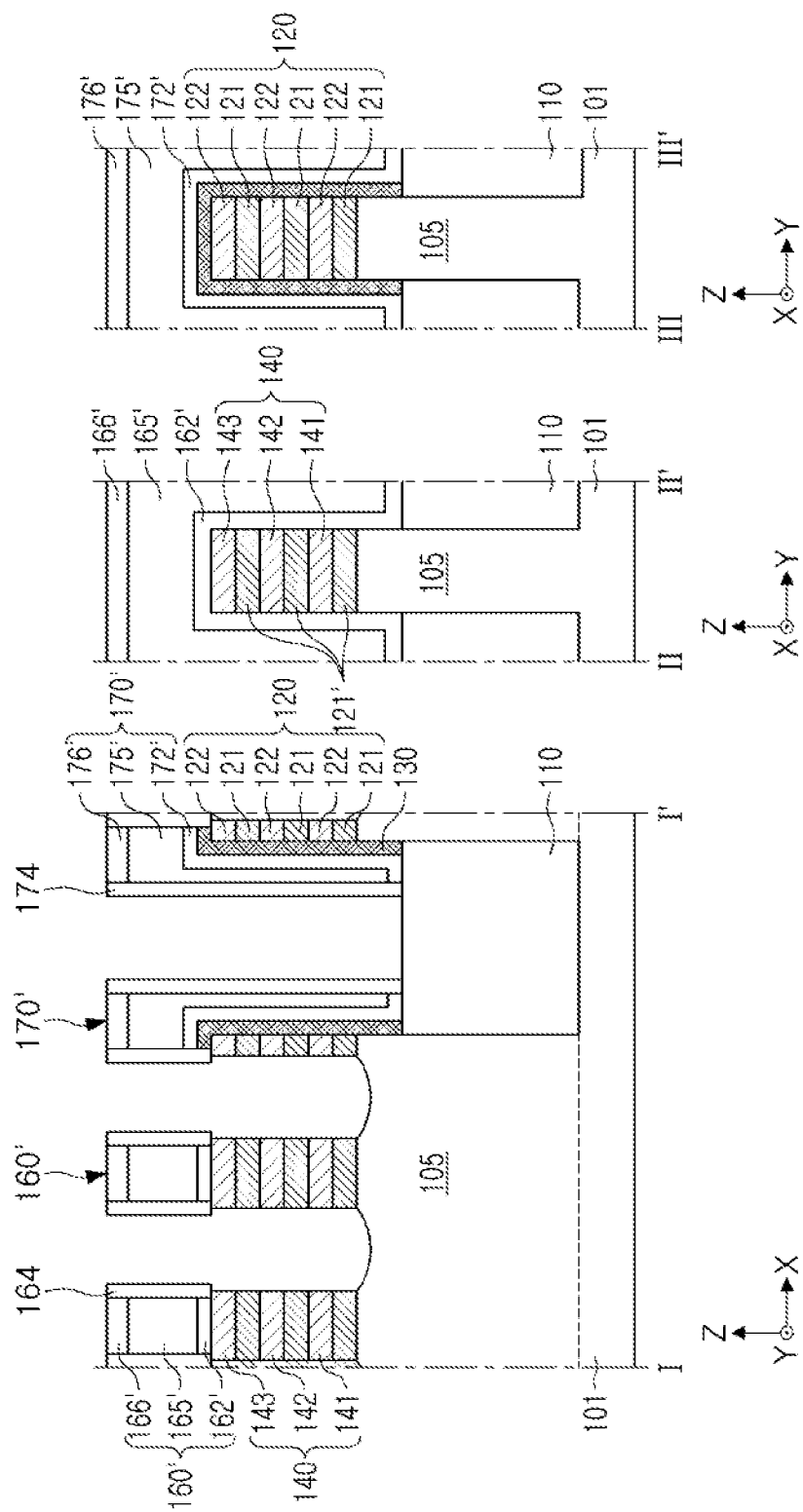

Referring to FIGS. 16A and 16B, exposed sacrificial layers 121' and channel layers 141, 142 and 143 between the first and second sacrificial gate structures 160' and 170' are removed, thereby forming the channel structures 140 and the semiconductor structures 120.

The exposed sacrificial layers 121' and channel layers 141, 142 and 143 may be removed using the first sacrificial gate structures 160' and the first spacer layers 164 as an etch mask. As a result, the channel layers 141, 142 and 143 have a limited length in the X direction and form the channel structure 140. According to an example embodiment of the present inventive concept, below the first sacrificial gate structures 160', the sacrificial layers 121' and the channel structure 140 are partially removed from the side surfaces such that both sides thereof in the X direction may be located below the first sacrificial gate structures 160' and the first spacer layers 164.

In the process of removing the exposed sacrificial layers 121' and the channel layers 141, 142 and 143, the sacrificial layers 121' and the channel layers 141, 142 and 143 adjacent to the separation region SR may remain as the semiconductor structure 120 including the first semiconductor layers 121 corresponding to the remaining sacrificial layers 121' and the second semiconductor layers 122 corresponding to the remaining channel layers 141, 142 and 143 adjacent to the separation region SR as illustrated in FIG. 2.

Figure 16C:
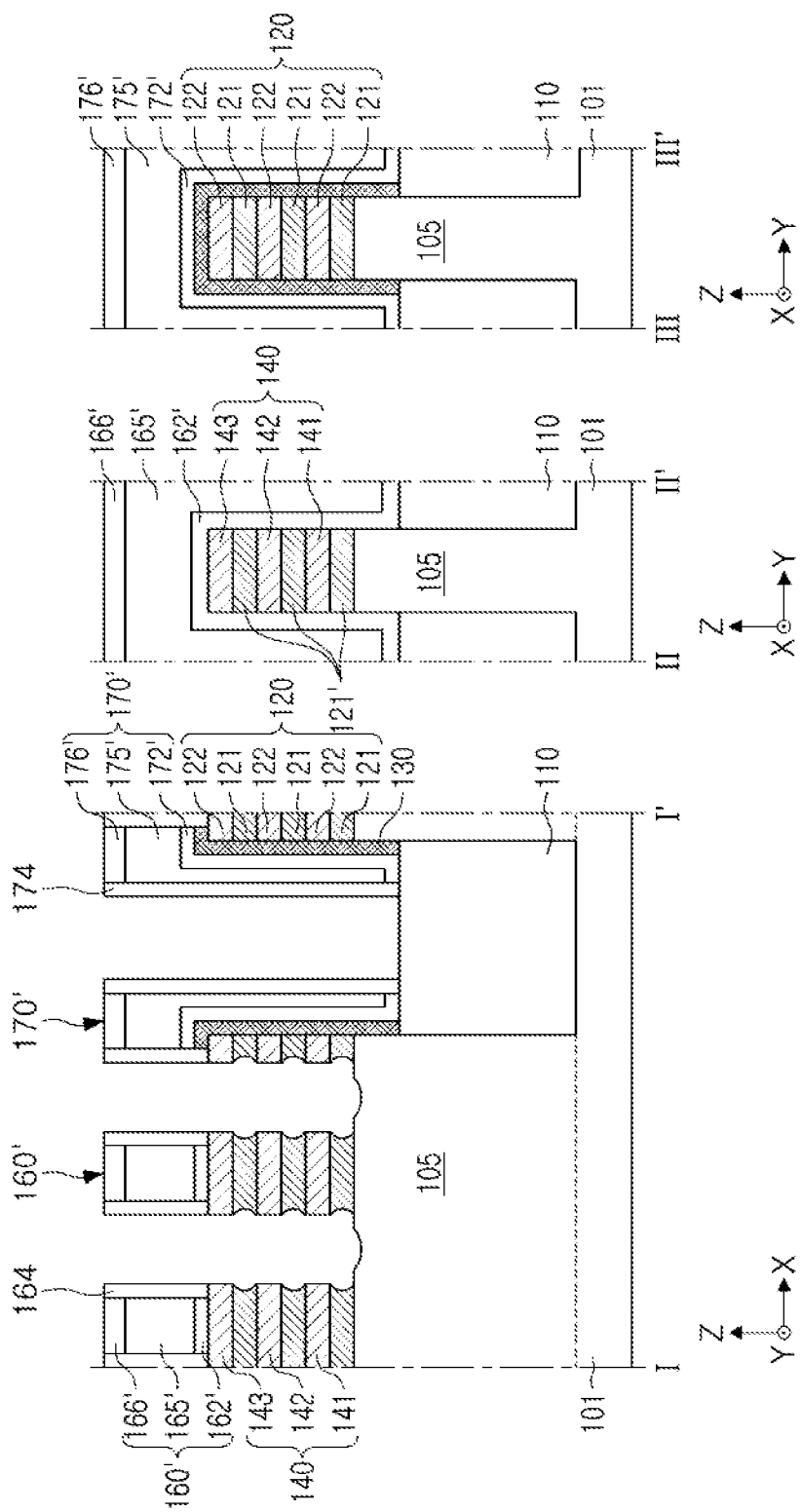

Referring to FIG. 16C, the exposed sacrificial layers 121' may be partially removed from the side surface.

The sacrificial layers 121' may be selectively etched with respect to the channel structures 140 by, for example, a wet etching process, and may be removed to a predetermined depth from the side surface in the X direction. The sacrificial layers 121' may have side surfaces that are concave inwardly by side etching as described above. However, the present inventive concept is not limited thereto. For example, the shape of the side surfaces of the sacrificial layers 121' may be different from those shown and illustrated above.

In the subsequent process, the internal spacer layers 161 may be formed in the region in which the sacrificial layers 121' have been removed to obtain the semiconductor device illustrated in FIG. 9A. The internal spacer layers 161 may be formed by filling an insulating material in a region in which the sacrificial layers 121' are removed, and removing the insulating material deposited on outer surfaces of the channel structures 140. Thus, each of the internal spacer layers 161 may have a convex shape toward a central portion of each of the sacrificial layers 121' in the X direction as shown in FIG. 9A. The internal spacer layers 161 may be formed of a material the same as that of the first spacer layers 164, but the present inventive concept is not limited thereto. For example, the internal spacer layers 161 may include at least one of, for example, silicon nitride ($Si_3N_4$), silicon carbonitride (SiCN), silicon oxycarbonitride (SiOCN), silicon borocarbonitride (SiBCN), or silicon boronitride (SiBN). The internal spacer layers 161 may protect the source/drain regions 150.

Figure 17A:
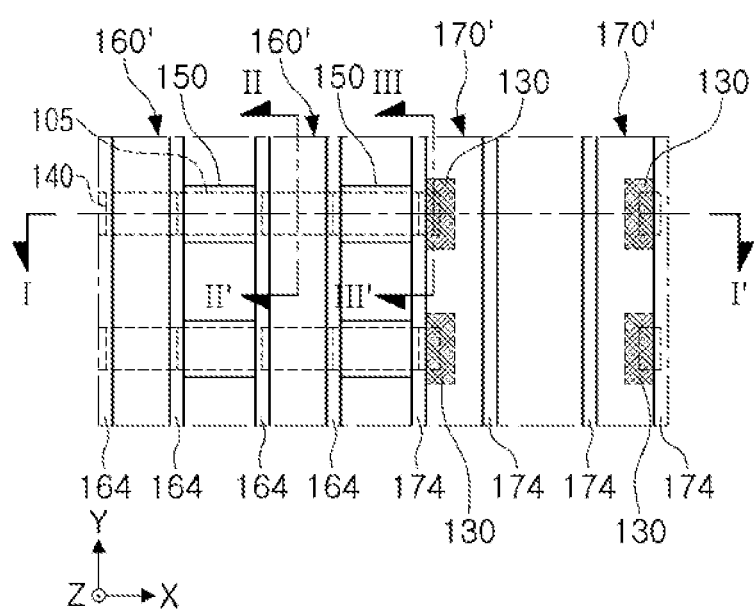
Figure 17B:
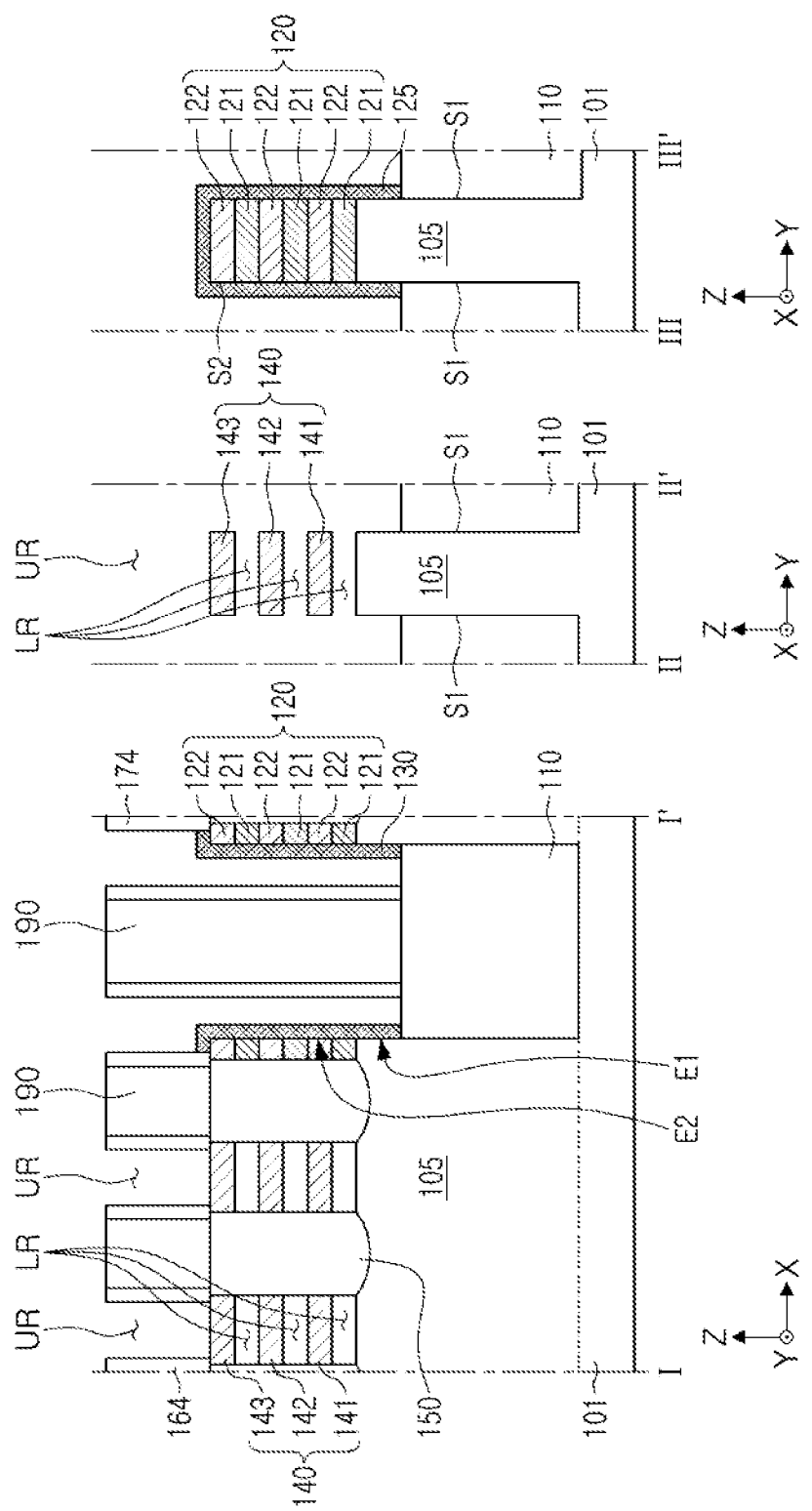

Referring to FIGS. 17A and 17B, on both sides of the first sacrificial gate structures 160', the source/drain regions 150 are formed on the active pattern 105, and an interlayer insulating layer 190 may be formed on the source/drain regions 150 and on the device isolation layer 110 in the separation region SR, and the sacrificial layers 121' and the first and second sacrificial gate structures 160' and 170' may be removed.

The source/drain regions 150 may be formed by performing an epitaxial growth process. For example, the source/drain regions 150 may be formed by performing a selective epitaxial growth (SEG) process using inner surfaces of the recessed region of the active pattern 105 as a seed layer. For example, the SEG process may include a chemical vapor deposition (CVD) process or a molecular beam epitaxy (MBE) process. The source/drain regions 150 may be connected to the plurality of channel layers 141, 142 and 143 of the channel structures 140 through side surfaces. The source/drain regions 150 may include impurities by in-situ doping, and may also include a plurality of layers having different doping elements and/or doping concentrations. In an example embodiment of the present inventive concept, impurities may be included in the source/drain regions 150 by in-situ doping during the SEG process for forming the source/drain regions 150.

The interlayer insulating layer 190 may be formed by forming an insulating layer covering the first and second sacrificial gate structures 160' and 170' and the source/drain regions 150 and performing a planarization process. The planarization process of the interlayer insulating layer 190 may be performed using an etch-back process or a chemical mechanical polishing (CMP) process.

The sacrificial layers 121' and the first and second sacrificial gate structures 160' and 170' may be selectively removed with respect to the first and second spacer layers 164 and 174, the interlayer insulating layer 190, and the channel structures 140. First, the first and second sacrificial gate structures 160' and 170' are removed to form upper gap regions UR, and then the sacrificial layers 121' exposed through the upper gap regions UR are removed to form lower gap regions LR. The lower gap regions LR may be formed by removing the sacrificial layers 121' under the upper gap regions UR formed by removing the first sacrificial gate structures 160', and may not be formed under or besides the upper gap regions UR formed by removing the second sacrificial gate structures 170'. For example, when the sacrificial layers 121' include silicon germanium (SiGe) and the channel structures 140 include silicon (Si), the sacrificial layers 121' may be selectively removed by performing a wet etching process using peracetic acid (PAA or $CH_3CO_3H$), which is a mixture of acetic acid ($CH_3COOH$) and hydrogen peroxide ($H_2O_2$), as an etchant.

During the removal process, the source/drain regions 150 may be protected by the interlayer insulating layer 190 and the blocking layer 130. Since the blocking layer 130 covers the semiconductor structure 120, the blocking layer 130 may prevent the etchant from penetrating through the semiconductor structure 120 from the exposed second side surfaces S2 or the second edge portion E2 of the semiconductor structure 120 in the separation region SR. Accordingly, a portion of the first semiconductor layers 121 of which the side surfaces are exposed through the second side surfaces S2 or the second edge portion E2 of the semiconductor structure 120 is not etched, thereby preventing the source/drain regions 150 from being damaged. Due to the formation of the blocking layer 130 covering the semiconductor structure 120 to protect the source/drain regions 150, a semiconductor device having enhanced reliability may be manufactured.

Figure 18A:
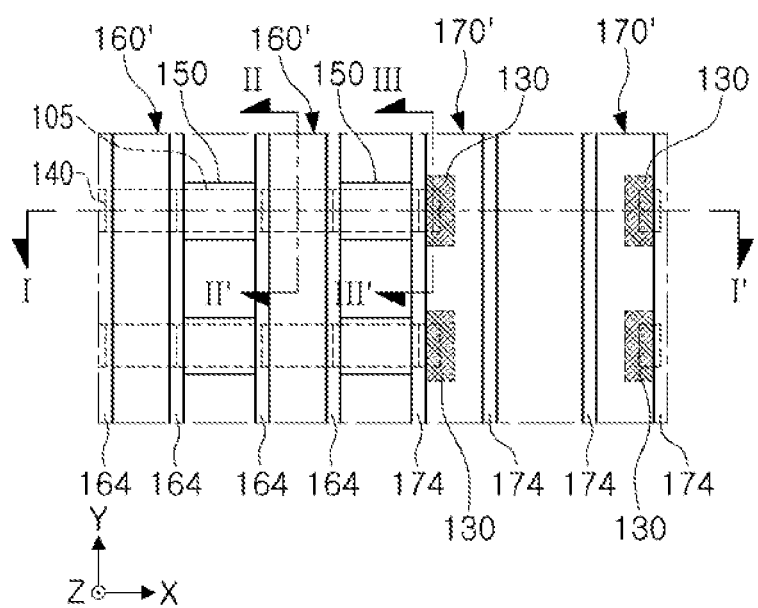
Figure 18B:
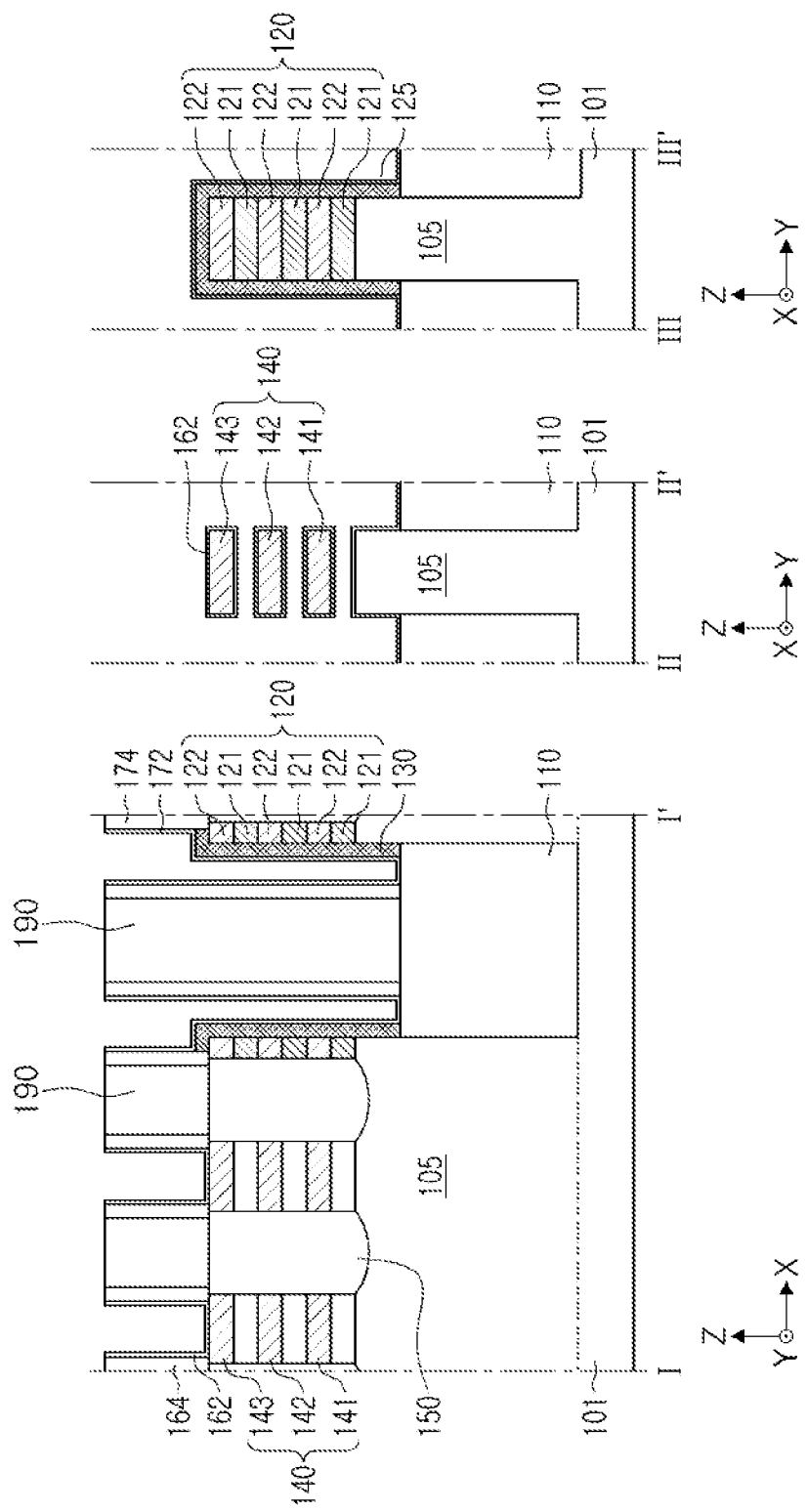

Referring to FIGS. 18A and 18B, first and second gate dielectric layers 162 and 172 may be formed in the upper gap regions UR and the lower gap regions LR, for the first gate structure 160 and the second gate structure 170, respectively. The first gate dielectric layer 162 may include, for example, oxide, nitride, or a high-k material, and may be formed of a single layer or multilayers.

The first and second gate dielectric layers 162 and 172 may be formed to conformally cover the inner surfaces of the upper gap regions UR and the lower gap regions LR. For example, the first and second gate dielectric layers 162 and 172 may be formed by an atomic layer deposition (ALD) process or a chemical vapor deposition (CVD) process.

Figure 19A:
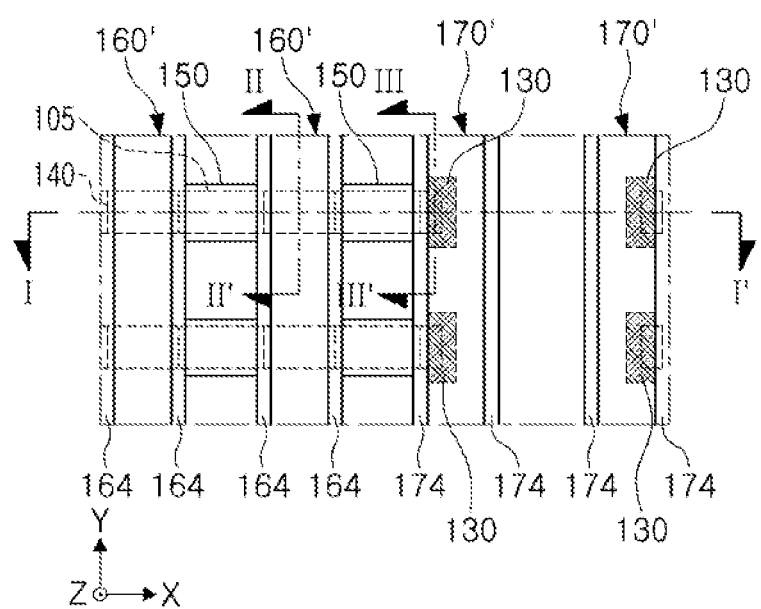
Figure 19B:
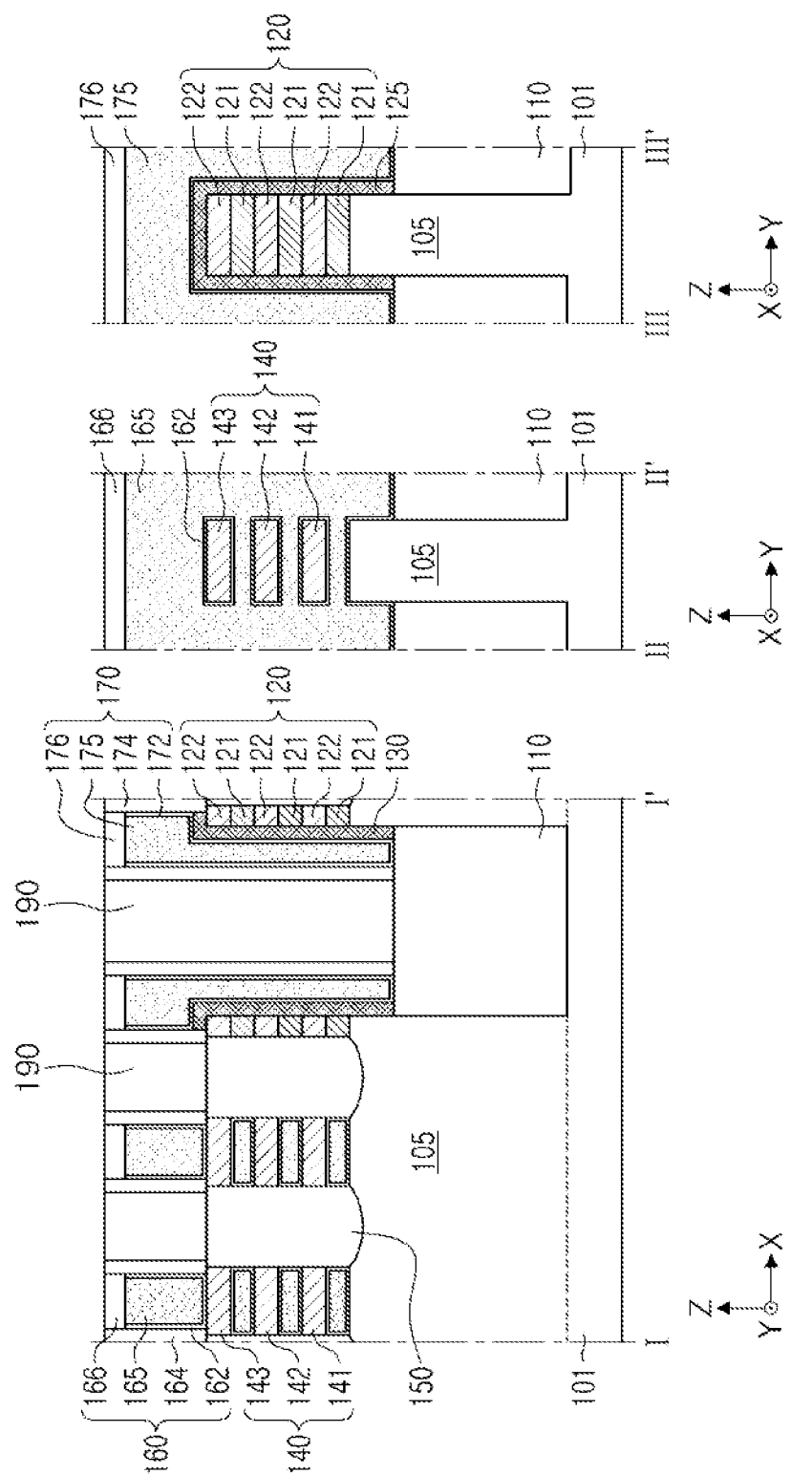

Referring to FIGS. 19A and 19B, first and second gate electrodes 165 and 175 may be formed to fill the upper gap regions UR and the lower gap regions LR on the first and second gate dielectric layers 162 and 172, respectively, and first and second gate capping layers 166 and 176 may be formed on the first and second gate electrodes 165 and 175, respectively.

The first and second gate electrodes 165 and 175 are formed to completely fill the upper gap regions UR and the lower gap regions LR, and then, may be removed from upper portions of the upper gap regions UR to a predetermined depth. The first and second gate capping layers 166 and 176 may be formed in regions in which the first and second gate electrodes 165 and 175 are removed from the upper gap regions UR. Side surfaces of the first gate capping layer 166 and the second gate capping layer 176 may be surrounded by the first spacer layers 164 and the second spacer layers 174, respectively. The upper surfaces of the first and second gate capping layers 166 and 176 may be substantially coplanar with the upper surfaces of the first and second spacer layers 164 and 174. Accordingly, the first gate structures 160 including the first gate dielectric layer 162, the first gate electrode 165, the first spacer layers 164 and the first gate capping layer 166, and the second gate structures 170 including the second gate dielectric layer 172, the second gate electrode 175, the second spacer layers 174 and the second gate capping layer 176 may be formed.

Next, referring to FIG. 2, contact plugs 180 may be formed.

First, the interlayer insulating layer 190 may be patterned to form contact holes, and the contact holes may be filled with a conductive material, thereby forming the contact plugs 180. The contact holes may be formed by removing the interlayer insulating layer 190 on both sides of the first and second gate structures 160 and 170 using a separate mask layer such as a photoresist pattern as an etch mask in an etching process. The photoresist pattern may be formed through a photolithography process. The lower surface of the contact holes may be recessed into the source/drain regions 150 or may have a curved shape along the upper surfaces of the source/drain regions 150. In an example embodiment of the present inventive concept, the shape and arrangement of the contact plugs 180 may be variously changed.

As set forth above, according to an example embodiment of the present inventive concept, a semiconductor device having enhanced reliability may be provided by disposing a blocking layer covering a semiconductor structure exposed in a separation region to protect source/drain regions.

While example embodiments have been illustrated and described above, it will be apparent to those skilled in the art that modifications and variations could be made without departing from the spirit and scope of the present inventive concept as defined by the appended claims.

What is claimed is:

1. A semiconductor device comprising:
   an active pattern extending on a substrate in a first direction and having first side surfaces opposing each other and a first edge portion connected to the first side surfaces;
   a plurality of channel layers spaced apart from each other vertically on the active pattern;
   a first gate electrode extending in a second direction, while intersecting the active pattern and the plurality of channel layers, on the substrate, and surrounding the plurality of channel layers;
   source/drain regions disposed on the active pattern, on at least one side of the first gate electrode, and contacting the plurality of channel layers;
   a semiconductor structure disposed adjacent to the first edge portion of the active pattern, and having second side surfaces opposing each other and a second edge portion connected to the second side surfaces, the semiconductor structure including a plurality of first semiconductor layers and a plurality of second semiconductor layers, alternately stacked on each other on the active pattern;
   a second gate electrode extending in the second direction on the substrate and covering the first edge portion of the active pattern and the second edge portion of the semiconductor structure; and
   a blocking layer disposed between the semiconductor structure and the second gate electrode.

2. The semiconductor device of claim 1, wherein the blocking layer extends between the first edge portion of the active pattern and the second gate electrode and between the second edge portion of the semiconductor structure and the second gate electrode.

3. The semiconductor device of claim 1, wherein the blocking layer covers an upper surface and the second side surfaces of the semiconductor structure.

4. The semiconductor device of claim 1, wherein a lower portion of the blocking layer is disposed to cover a portion of a lower surface of the second gate electrode.

5. The semiconductor device of claim 1, wherein the blocking layer has a concavo-convex shape on one surface opposite to a surface contacting the second edge portion of the semiconductor structure.

6. The semiconductor device of claim 1, wherein the blocking layer comprises a material different from a material of the plurality of first semiconductor layers.

7. The semiconductor device of claim 1, wherein the blocking layer comprises a material the same as a material of the plurality of second semiconductor layers.

8. The semiconductor device of claim 1, wherein the blocking layer comprises an epitaxial layer grown from the semiconductor structure.

9. The semiconductor device of claim 1, wherein the blocking layer comprises at least one of silicon, germanium, silicon germanium, silicon carbide, or silicon nitride.

10. The semiconductor device of claim 1, further comprising contact plugs disposed on the source/drain regions and connected to the source/drain regions.

11. The semiconductor device of claim 1, further comprising a device isolation layer being in contact with the first side surfaces and the first edge portion of the active pattern,
    wherein a lower surface of the blocking layer is in contact with an upper surface of the device isolation layer.

12. The semiconductor device of claim 1, further comprising internal spacer layers disposed on both sides of the first gate electrode in the first direction, and on respective lower surfaces of the plurality of channel layers, the internal spacer layers having external surfaces substantially coplanar with external surfaces of the plurality of channel layers.

13. A semiconductor device comprising:
    an active pattern extending on a substrate in a first direction, divided into a plurality of regions by a separation region, and having a first edge portion exposed toward the separation region;
    first, second and third channel layers vertically spaced apart from each other and sequentially disposed on the active pattern;
    a first gate electrode extending in a second direction while intersecting the active pattern, on the substrate, and surrounding the first, second and third channel layers;
    source/drain regions disposed on the active pattern, on at least one side of the first gate electrode, and contacting the first, second and third channel layers;
    a semiconductor structure including first semiconductor layers and second semiconductor layers alternately stacked on the active pattern, and having a second edge portion exposed toward the separation region; and
    a blocking layer covering at least one of an upper surface, side surfaces, or the second edge portion, of the semiconductor structure.

14. The semiconductor device of claim 13, wherein the blocking layer covers the upper surface of the semiconductor structure.

15. The semiconductor device of claim 13, wherein the blocking layer comprises a material different from a material of the first semiconductor layers.

16. The semiconductor device of claim 13, further comprising:
    a second gate electrode extending in the second direction while intersecting the active pattern, on the substrate, and covering at least a portion of the semiconductor structure;
    a gate dielectric layer disposed between the blocking layer and the second gate electrode; and
    spacer layers disposed on both side surfaces of the second gate electrode.

17. The semiconductor device of claim 16, wherein the gate dielectric layer covers an upper surface and side surfaces of the blocking layer, and comprises a portion that is disposed between the blocking layer and the second gate electrode and further downwardly extends lower than the semiconductor structure.

18. The semiconductor device of claim 16, wherein at least one of the spacer layers further extends to be lower than the semiconductor structure.

19. The semiconductor device of claim 13, wherein each of the second semiconductor layers is disposed at a height the same as that of each corresponding one of the first, second and third channel layers, and is in contact with the source/drain regions.

20. A semiconductor device comprising:
- an active pattern extending on a substrate in a first direction, and divided into a plurality of regions by a separation region;
- a semiconductor structure disposed adjacent to the separation region, on the active pattern;
- a first gate electrode extending in a second direction while intersecting the active pattern, on the substrate;
- a second gate electrode extending in the second direction while intersecting the semiconductor structure, on the substrate, and covering the semiconductor structure;
- source/drain regions disposed on the active pattern, on at least one side of the first gate electrode; and
- a blocking layer covering the semiconductor structure.

* * * * *